United States Patent
Retz et al.

(10) Patent No.: US 11,973,469 B2
(45) Date of Patent: Apr. 30, 2024

(54) SYSTEMS AND METHODS FOR PROVIDING AN ENVELOPE TRACKING SUPPLY VOLTAGE

(71) Applicant: Qorvo US, Inc., Greensboro, NC (US)

(72) Inventors: James M. Retz, Cedar Rapids, IA (US); Nadim Khlat, Cugnaux (FR)

(73) Assignee: Qorvo US, Inc., Greensboro, NC (US)

( * ) Notice: Subject to any disclaimer, the term of this patent is extended or adjusted under 35 U.S.C. 154(b) by 504 days.

(21) Appl. No.: 17/351,744

(22) Filed: Jun. 18, 2021

(65) Prior Publication Data

US 2022/0052649 A1 Feb. 17, 2022

Related U.S. Application Data

(60) Provisional application No. 63/064,773, filed on Aug. 12, 2020, provisional application No. 63/064,784, filed on Aug. 12, 2020, provisional application No. 63/090,566, filed on Oct. 12, 2020, provisional application No. 63/090,574, filed on Oct. 12, 2020, provisional application No. 63/090,583, filed on Oct.
(Continued)

(51) Int. Cl.
| | | |
|---|---|---|
| *H03F 1/30* | (2006.01) | |
| *H03F 1/02* | (2006.01) | |
| *H03F 1/32* | (2006.01) | |
| *H03F 1/56* | (2006.01) | |
| *H03F 3/195* | (2006.01) | |
| *H03F 3/21* | (2006.01) | |
| *H03F 3/24* | (2006.01) | |

(52) U.S. Cl.
CPC ......... *H03F 1/0233* (2013.01); *H03F 1/0227* (2013.01); *H03F 1/3241* (2013.01); *H03F 1/3258* (2013.01); *H03F 1/56* (2013.01); *H03F 3/195* (2013.01); *H03F 3/21* (2013.01); *H03F 3/245* (2013.01); *H03F 2200/102* (2013.01); *H03F 2200/105* (2013.01); *H03F 2200/451* (2013.01); *H03F 2201/3209* (2013.01)

(58) Field of Classification Search
CPC ................ H03F 1/30; H03F 1/32; H03G 3/20
USPC ................................ 330/297, 129, 136, 149
See application file for complete search history.

(56) References Cited

U.S. PATENT DOCUMENTS

| | | | |
|---|---|---|---|
| 8,093,945 B2 * | 1/2012 | Wimpenny | H03F 1/0227 330/285 |
| 8,159,309 B1 | 4/2012 | Khlat et al. | |

(Continued)

OTHER PUBLICATIONS

Wan et al. "Negative Group Delay Theory of a Four-Port RC-Network Feedback Operational Amplifier" IEEE Access, vol. 7, 2019, pp. 75708-75720.

(Continued)

*Primary Examiner* — Henry Choe
(74) *Attorney, Agent, or Firm* — Withrow & Terranova, P.L.L.C.

(57) ABSTRACT

Envelope tracking power supply circuitry includes a look up table (LUT) configured to provide a target supply voltage based on a power envelope measurement. The target supply voltage is dynamically adjusted based on a delay between the power envelope of an RF signal and a provided envelope tracking supply voltage. The envelope tracking supply voltage is generated from the adjusted target supply voltage in order to synchronize the envelope tracking supply voltage with the power envelope of the RF signal.

19 Claims, 32 Drawing Sheets

Related U.S. Application Data 12, 2020, provisional application No. 63/112,430, filed on Nov. 11, 2020.

(56) References Cited

U.S. PATENT DOCUMENTS

| | | |
|---|---|---|
| 9,002,303 B2 | 4/2015 | Brobston |
| 9,923,520 B1 | 3/2018 | Abdelfattah et al. |
| 10,158,329 B1 | 12/2018 | Khlat |
| 10,530,305 B2 | 1/2020 | Folkmann et al. |
| 10,622,948 B2 | 4/2020 | Khlat |
| 10,680,559 B2 | 6/2020 | Khlat et al. |
| 10,911,001 B2 | 2/2021 | Khlat et al. |
| 11,677,365 B2 | 6/2023 | Khlat |
| 2007/0249304 A1 | 10/2007 | Snelgrove et al. |
| 2012/0039487 A1 | 2/2012 | Sakai |
| 2012/0302179 A1 | 11/2012 | Brobston et al. |
| 2013/0076418 A1 | 3/2013 | Belitzer et al. |
| 2014/0199949 A1 | 7/2014 | Nagode et al. |
| 2014/0213196 A1 | 7/2014 | Langer et al. |
| 2014/0266423 A1 | 9/2014 | Drogi et al. |
| 2014/0361837 A1 | 12/2014 | Strange et al. |
| 2016/0164550 A1 | 6/2016 | Pilgram |
| 2016/0182100 A1 | 6/2016 | Menkhoff et al. |
| 2016/0249300 A1* | 8/2016 | Tsai ............... H04B 17/13 |
| 2016/0277045 A1 | 9/2016 | Langer |
| 2017/0359784 A1 | 12/2017 | Kumar et al. |
| 2018/0358942 A1 | 12/2018 | Hurwitz |
| 2019/0215023 A1 | 7/2019 | Abouelenin |
| 2020/0036338 A1 | 1/2020 | Gorisse et al. |
| 2021/0067097 A1 | 3/2021 | Wang et al. |
| 2021/0194522 A1 | 6/2021 | Stockert et al. |
| 2022/0115987 A1 | 4/2022 | Granger-Jones |
| 2022/0115988 A1 | 4/2022 | Khlat et al. |
| 2022/0116029 A1 | 4/2022 | Khlat et al. |
| 2022/0360229 A1 | 11/2022 | Khlat |
| 2023/0122151 A1 | 4/2023 | He et al. |

OTHER PUBLICATIONS

U.S. Appl. No. 17/331,739, filed May 27, 2021.
U.S. Appl. No. 17/331,756, filed May 27, 2021.
U.S. Appl. No. 17/351,667, filed Jun. 18, 2021.
U.S. Appl. No. 17/351,695, filed Jun. 18, 2021.
U.S. Appl. No. 17/351,716, filed Jun. 18, 2021.
U.S. Appl. No. 17/351,768, filed Jun. 18, 2021.
Notice of Allowance for U.S. Appl. No. 17/331,739, filed Oct. 24, 2023, 7 pages.
Notice of Allowance for U.S. Appl. No. 17/331,756, filed Oct. 25, 2023, 8 pages.
Notice of Allowance for U.S. Appl. No. 17/351,667, filed Oct. 4, 2023, 8 pages.
Notice of Allowance for U.S. Appl. No. 17/351,695, filed Nov. 13, 2023, 8 pages.
Non-Final Office Action for U.S. Appl. No. 17/351,716, filed Dec. 6, 2023, 7 pages.
Notice of Allowance for U.S. Appl. No. 17/351,768, filed Oct. 20, 2023, 7 pages.

* cited by examiner

SYSTEMS AND METHODS FOR PROVIDING AN ENVELOPE TRACKING SUPPLY VOLTAGE

RELATED APPLICATIONS

This application claims the benefit of provisional patent application Ser. No. 63/064,773, filed Aug. 12, 2020, provisional patent application Ser. No. 63/064,784, filed Aug. 12, 2020, provisional patent application Ser. No. 63/090,566, filed Oct. 12, 2020, provisional patent application Ser. No. 63/090,574, filed Oct. 12, 2020, provisional patent application Ser. No. 63/090,583, filed Oct. 12, 2020, and provisional patent application Ser. No. 63/112,430, filed Nov. 11, 2020, the disclosures of which are hereby incorporated herein by reference in their entireties.

FIELD OF THE DISCLOSURE

The present disclosure is related to systems and methods for providing an envelope tracking supply voltage, and in particular to systems and methods for providing an envelope tracking supply voltage for radio frequency (RF) signals.

BACKGROUND

Envelope tracking power supplies for radio frequency (RF) power amplifiers enable increased linearity and efficiency by providing a supply voltage that tracks a power envelope of an RF signal. Due to the mechanics associated with generating the signal, an envelope tracking supply voltage may be delayed or advanced with respect to the RF signal. This may cause excessive power consumption, compression, and/or clipping in the RF power amplifier. Conventional synchronization between envelope tracking power supply signals and RF signals often fails to adequately synchronize the signals, especially for high bandwidth signals such as those for fifth generation (5G) and mmWave applications. Accordingly, there is a need for improved systems and methods for providing an envelope tracking supply voltage.

SUMMARY

In one embodiment, a radio frequency (RF) system includes transceiver circuitry. The transceiver circuitry includes envelope detector circuitry, a look-up-table, envelope synchronization circuitry, and digital pre-distortion (DPD) circuitry. The envelope detector circuitry is configured to generate a power envelope measurement indicative of a power envelope of an RF signal based on a baseband input signal. The LUT is configured to provide a target supply voltage based on the power envelope measurement. The envelope synchronization circuitry is configured to adjust the target supply voltage based on a delay between the target supply voltage and the power envelope of the RF signal to provide an adjusted target supply voltage that is synchronized in time with the power envelope of the RF signal. The DPD circuitry is configured to pre-distort the baseband input signal based on the adjusted target supply voltage to provide a pre-distorted baseband input signal. By pre-distorting the baseband input signal based on the adjusted supply voltage, the effect of using an envelope tracking supply voltage that has been adjusted to be synchronized in time with the power envelope of the RF signal can be cancelled in the resulting RF output signal.

In another aspect, any of the foregoing aspects individually or together, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
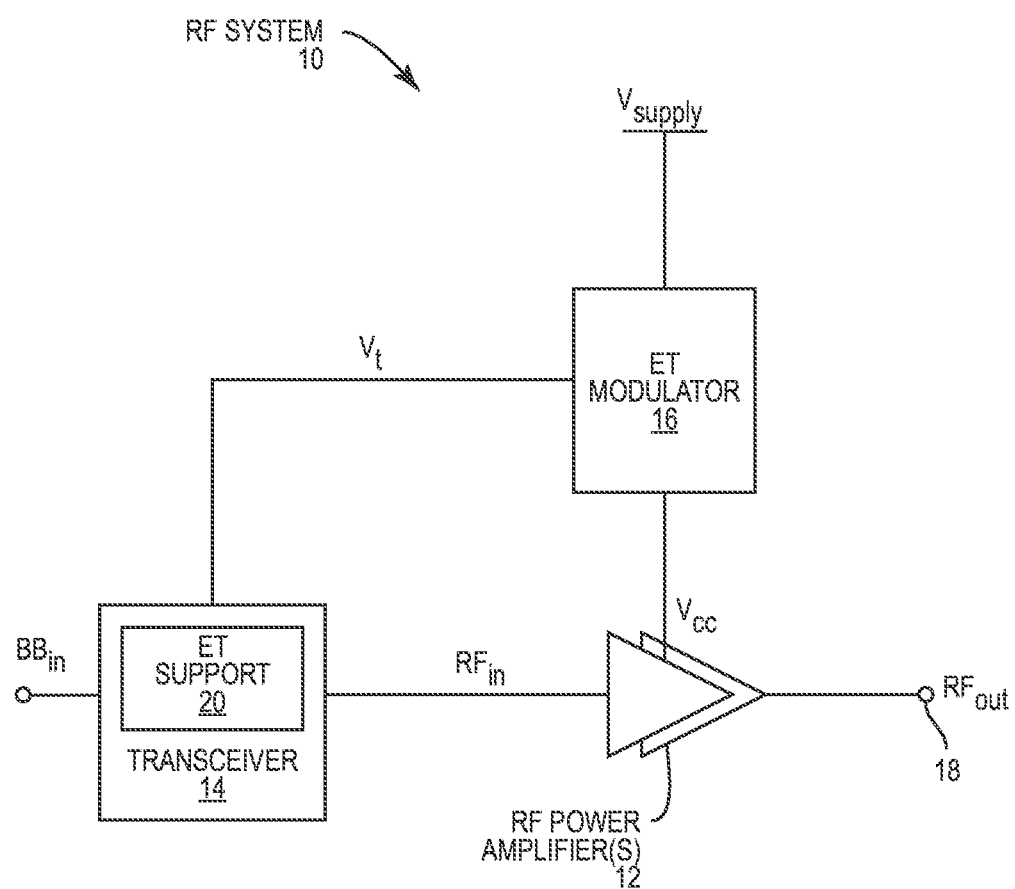
FIG. 1 is a functional schematic illustrating a radio frequency (RF) system according to one embodiment of the present disclosure.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments are described herein with reference to schematic illustrations of embodiments of the disclosure. As such, the actual dimensions of the layers and elements can be different, and variations from the shapes of the illustrations as a result, for example, of manufacturing techniques and/or tolerances, are expected. For example, a region illustrated or described as square or rectangular can have rounded or curved features, and regions shown as straight lines may have some irregularity. Thus, the regions illustrated in the figures are schematic and their shapes are not intended to illustrate the precise shape of a region of a device and are not intended to limit the scope of the disclosure. Additionally, sizes of structures or regions may be exaggerated relative to other structures or regions for illustrative purposes and, thus, are provided to illustrate the general structures of the present subject matter and may or may not be drawn to scale. Common elements between figures may be shown herein with common element numbers and may not be subsequently re-described.

FIG. 1 is a functional schematic illustrating a radio frequency (RF) system 10 according to one embodiment of the present disclosure. The RF system 10 includes one or more RF power amplifiers 12, transceiver circuitry 14, and envelope tracking modulator circuitry 16. The one or more RF power amplifiers 12 are coupled between the transceiver circuitry 14 and an RF output 18, which may be coupled to one or more antennas (not shown). The envelope tracking modulator circuitry 16 is coupled between the transceiver circuitry 14 and the one or more RF power amplifiers 12. In particular, the envelope tracking modulator circuitry 16 is coupled between envelope tracking support circuitry 20 in the transceiver circuitry 14 and the one or more RF power amplifiers 12.

In operation, the transceiver circuitry 14 is configured to receive a baseband input signal $BB_{in}$ and modulate the baseband input signal $BB_{in}$ to generate an RF input signal $RF_{in}$, which is provided to the one or more RF power amplifiers 12. The envelope tracking support circuitry 20 in the transceiver circuitry 14 is configured to generate a target supply voltage $V_t$ based on the RF input signal $RF_{in}$. The target supply voltage $V_t$ represents a target voltage to be provided to the one or more RF power amplifiers 12 that tracks a power envelope of the RF input signal $RF_{in}$ such that a desired headroom is maintained when amplifying the RF input signal $RF_{in}$, and is therefore indicative of a power envelope of the RF input signal $RF_{in}$. The envelope tracking modulator circuitry 16 receives the target supply voltage $V_t$ and a supply voltage $V_{supply}$, e.g., a battery voltage, and modulates the supply voltage $V_{supply}$ based on the target supply voltage $V_t$ to provide an envelope tracking supply voltage $V_{cc}$. In one embodiment, the envelope tracking modulator circuitry 16 performs a simple linear amplification of the target supply voltage $V_t$ to provide the envelope tracking supply voltage $V_{cc}$. The one or more RF power amplifiers 12 receive the RF input signal $RF_{in}$ and the envelope tracking supply voltage $V_{cc}$, and amplify the RF input signal $RF_{in}$ using the envelope tracking supply voltage $V_{cc}$ to provide an RF output signal $RF_{out}$ at the RF output 18.

Those skilled in the art will appreciate that if the envelope tracking supply voltage $V_{cc}$ accurately tracks the power envelope of the RF output signal $RF_{out}$, a constant headroom can be maintained when amplifying the RF input signal $RF_{in}$ that keeps the one or more RF power amplifiers 12 operating at peak efficiency and/or linearity and thus improves the performance of the RF system 10. However, providing the envelope tracking supply voltage $V_{cc}$ in such a manner is often quite difficult. In the embodiment in FIG. 1, the envelope tracking support circuitry 20 in the transceiver circuitry 14 must provide the target supply voltage $V_t$ such that the envelope tracking supply voltage $V_{cc}$ and the power envelope of the RF output signal $RF_{out}$ are synchronized in time. Often, this is quite difficult because generating the target supply voltage $V_t$ involves inherent delays that cause the envelope tracking supply voltage $V_{cc}$ to be out of sync with the power envelope of the RF output signal $RF_{out}$. In some situations, it may be desirable in many applications to reduce the complexity of transceiver circuitry 14 and offload all or most of the envelope tracking functionality for an RF system 10 into a single component or chip. Further, some situations (e.g., fifth generation (5G) and mmWave applications) require the transceiver circuitry 14 to be located a long distance from the one or more RF power amplifiers 12 and thus the envelope tracking modulator circuitry 16, making it impractical to provide the target voltage $V_t$ from the envelope tracking support circuitry 20 to the envelope tracking modulator circuitry 16 as shown.

Figure 2:
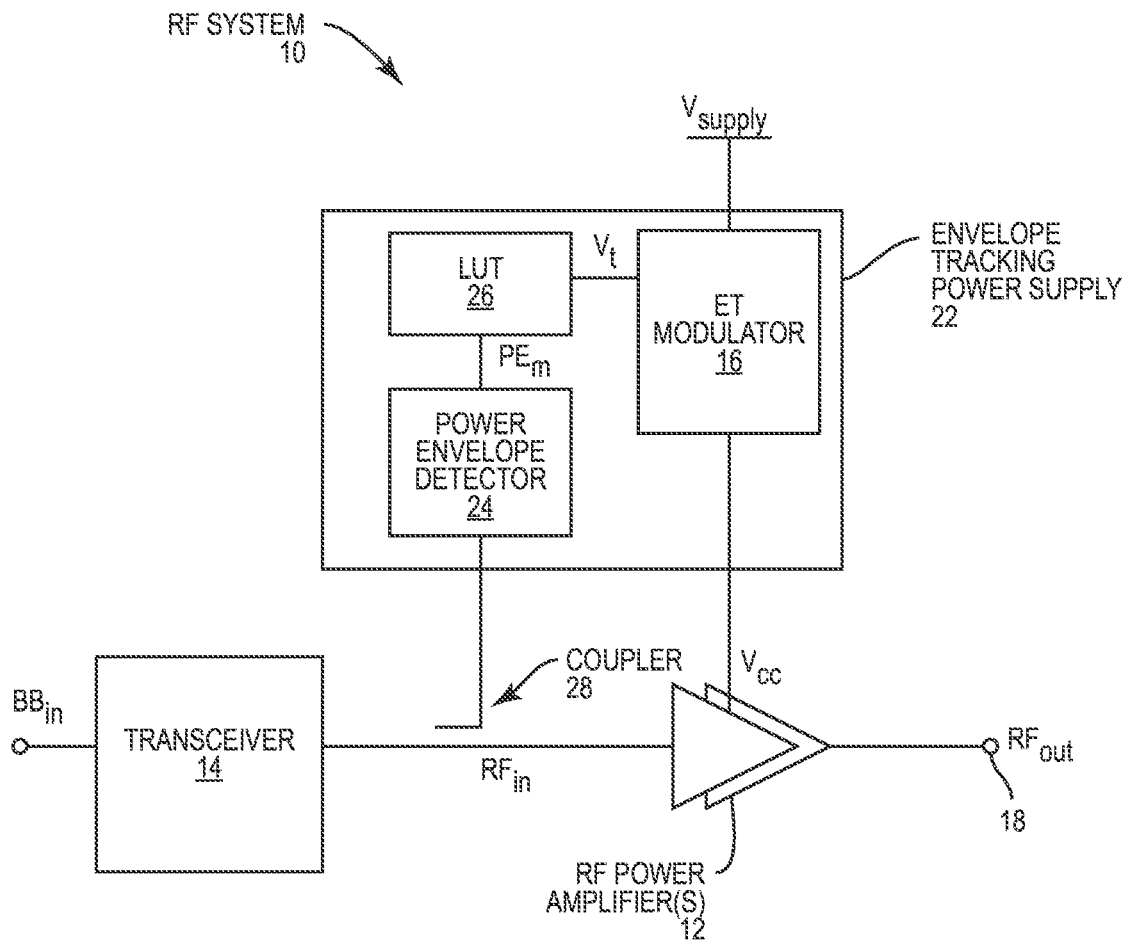
FIG. 2 is a functional schematic illustrating an RF system according to one embodiment of the present disclosure.

Accordingly, FIG. 2 shows the RF system 10 according to an additional embodiment of the present disclosure. The RF system 10 shown in FIG. 2 is substantially similar to that shown in FIG. 1, except that the envelope tracking support circuitry 20 is removed from the transceiver circuitry 14 and additional functionality is added to the envelope tracking modulator circuitry 16 to provide envelope tracking power supply circuitry 22. In particular, the envelope tracking power supply circuitry 22 includes the envelope tracking modulator circuitry 16, power envelope detector circuitry 24, and a look up table (LUT) 26. The power envelope detector circuitry 24 is between a coupler 28 and the LUT 26. The power envelope detector circuitry 24 is configured to measure a power envelope of the RF input signal $RF_{in}$ provided from the transceiver circuitry 14 to the one or more RF power amplifiers 12 via the coupler 28, providing a power envelope measurement $PE_m$ to the LUT 26. The LUT 26 is between the power envelope detector circuitry 24 and the envelope tracking modulator circuitry 16. The LUT 26 is configured to look up a target supply voltage $V_t$ based on the power envelope measurement $PE_m$ via a known relationship between the power envelope measurement $PE_m$ and the target supply voltage $V_t$ for maintaining a desired efficiency and/or linearity of the one or more RF power amplifiers 12. The target supply voltage $V_t$ is provided to the envelope tracking modulator circuitry 16. The envelope tracking modulator circuitry 16 operates as described above, modulating the supply voltage $V_{supply}$ based on the target supply voltage $V_t$ to provide the envelope tracking supply voltage $V_{cc}$ to the one or more RF power amplifiers 12.

The RF system 10 shown in FIG. 2 has the advantage of providing all circuitry necessary for envelope tracking in the envelope tracking power supply circuitry 22, thereby allowing the transceiver 14 to be independent of the envelope tracking functionality and thus not specialized for any particular envelope tracking application. This may be particularly useful in 5G or mmWave applications wherein the transceiver 14 is located relatively far away from the envelope tracking power supply circuitry 22, presenting challenges to the delivery of the target voltage $V_t$ thereto.

Figure 3:
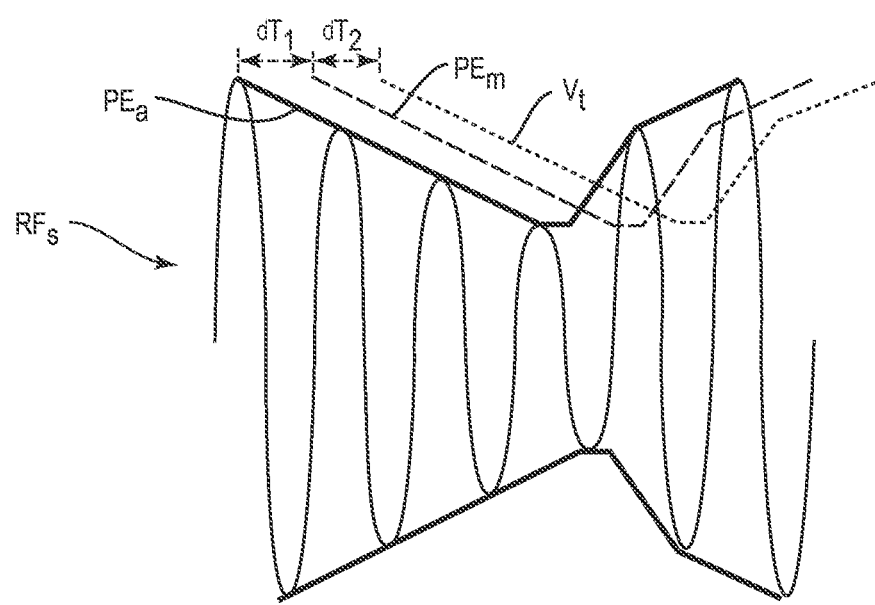
FIG. 3 is a graph illustrating an RF signal, corresponding power envelope, and an envelope tracking supply voltage according to one embodiment of the present disclosure.

As discussed above, the measurement of the power envelope of the RF input signal $RF_{in}$ will always have a delay associated with it, resulting in a delayed envelope tracking supply voltage $V_{cc}$. This is illustrated in the graph in FIG. 3, which shows an exemplary RF signal $RF_s$, an actual power envelope $PE_a$ of the exemplary RF signal $RF_s$, a measured power envelope $PE_m$ of the exemplary RF signal $RF_s$, and a target supply voltage $V_t$ based on the measured power envelope $PE_m$ as provided from the LUT 26. As shown, there is a delay $dT_1$ between the measured power envelope $PE_m$ and the actual power envelope $PE_a$ of the exemplary RF signal $RF_s$, and an additional delay $dT_2$ between the measured power envelope $PE_m$ and the target supply voltage $V_t$. As shown in the right-hand portion of the drawing, this will cause compression and/or clipping of signals amplified by the one or more RF power amplifiers 12. It is therefore desirable to minimize delays between the envelope tracking supply voltage $V_{cc}$ and the actual power envelope $PE_a$ of the exemplary RF signal $RF_s$.

Figures 4A, 4B:
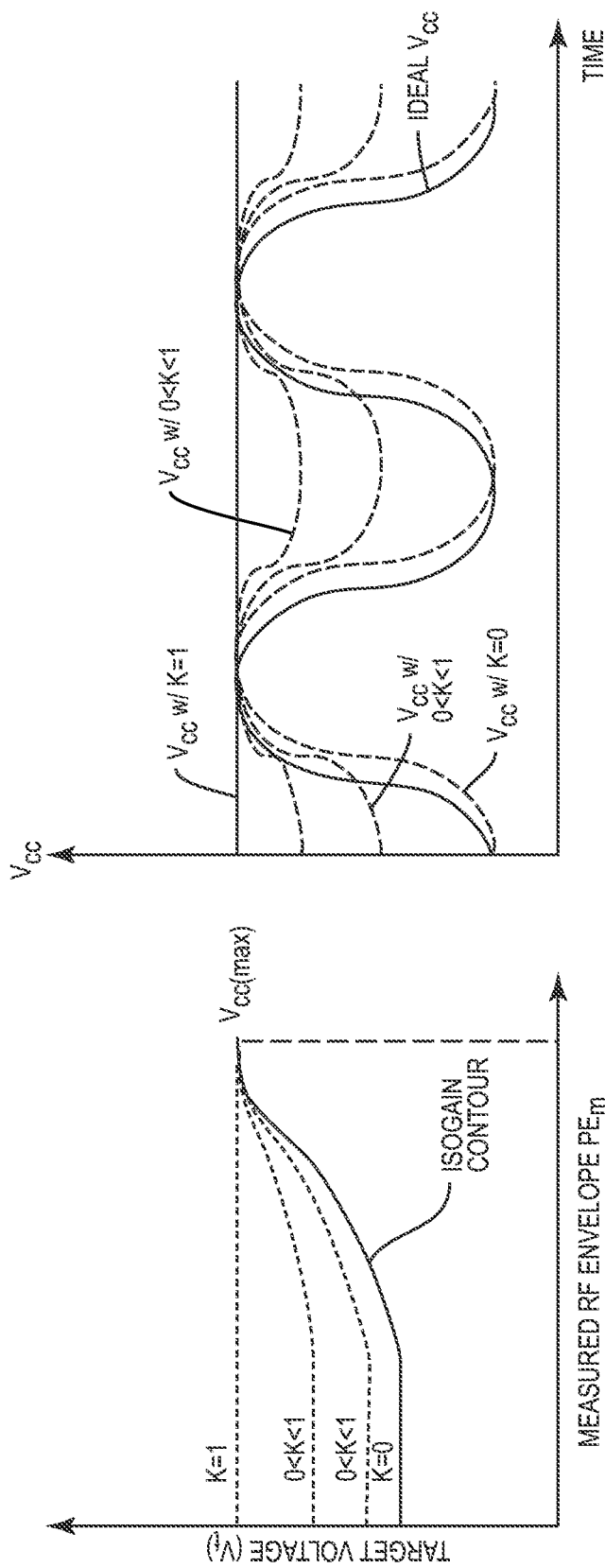
FIG. 4A is a graph illustrating an isogain contour for an RF power amplifier and corresponding slope adjustments according to one embodiment of the present disclosure.
FIG. 4B is a graph illustrating an RF signal and corresponding envelope tracking supply voltages according to one embodiment of the present disclosure.

Those skilled in the art will appreciate that the target supply voltage $V_t$ may be provided based on an isogain contour for the one or more RF power amplifiers 12, where an isogain contour expresses a relationship between the power envelope of RF signals amplified by the one or more RF power amplifiers 12 and the envelope tracking supply voltage $V_{cc}$ that will maximize the linearity and/or efficiency of the one or more RF power amplifiers 12. The LUT 26 may thus provide the target supply voltage $V_t$ based on an isogain contour for the one or more RF power amplifiers 12. FIG. 4A is a graph illustrating an exemplary isogain contour (solid line) according to one embodiment of the present disclosure. As shown, the isogain contour expresses a relationship between the measured power envelope $PE_m$ and the target supply voltage $V_t$. Generally, providing the target supply voltage $V_t$ based on the isogain contour will lead to maximum linearity of the one or more RF power amplifiers 12.

However, as discussed above, due to delays in the measurement of the power envelope and the resulting target supply voltage $V_t$, simply providing the target supply voltage $V_t$ according to the isogain contour may lead to compression and/or clipping. One way to avoid these issues is to change a slope adjustment value, referred to herein as K, of the isogain contour depending on the amount of delay between the actual power envelope of an RF signal, the measured power envelope thereof, and the resulting envelope tracking supply voltage. As shown by the dashed lines in FIG. 4A, K can be varied from zero, resulting in the isogain contour itself, to one, which results in a straight horizontal line, such that a higher K results in a reduced slope of the isogain contour. FIG. 4B illustrates how changing K affects the resulting envelope tracking supply voltage $V_{cc}$. A solid line in FIG. 4B illustrates an ideal envelope tracking supply voltage $V_{cc}$ having no delay with respect to the power envelope of an RF signal. A first dashed line marked with K=0 illustrates the actual envelope tracking supply voltage $V_{cc}$ produced when the target supply voltage $V_t$ is provided as discussed above according to the isogain contour. As shown, the actual envelope tracking supply voltage $V_{cc}$ is significantly delayed with respect to the ideal envelope tracking supply voltage $V_{cc}$. Additional dashed lines marked 0<K<1 illustrate the effect of increasing the slope adjustment value K of the isogain contour, resulting in less accurate envelope tracking, but also less clipping between the ideal envelope tracking supply voltage $V_{cc}$ and the actual envelope tracking supply voltage $V_{cc}$. When K reaches one as illustrated by the dashed line marked K=1, the envelope tracking supply voltage $V_{cc}$ is provided as a constant value no matter the power envelope of the RF signal, resulting in average power tracking (no envelope tracking).

Figure 5:
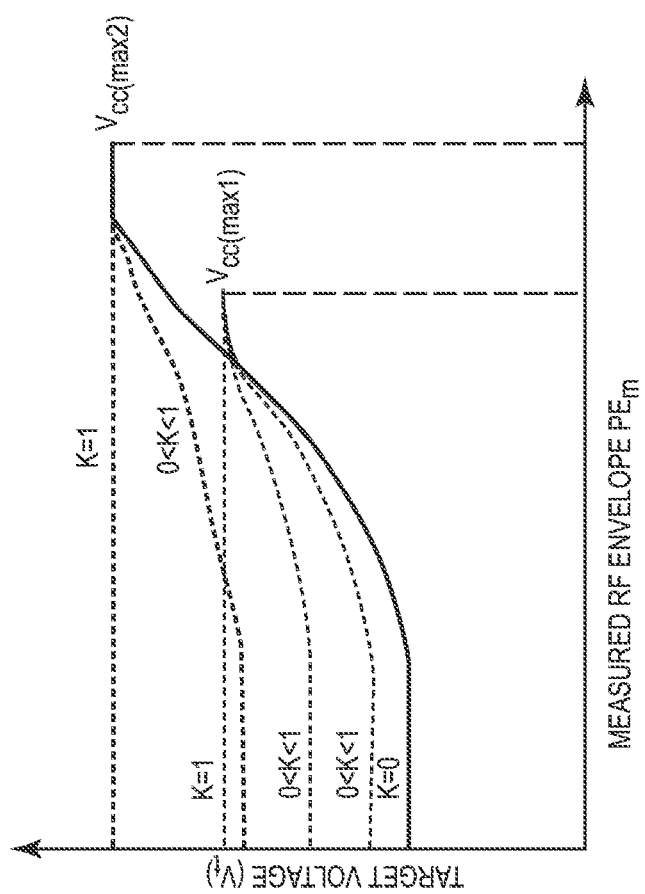
FIG. 5 is a graph illustrating an isogain contour for an RF power amplifier and corresponding slope and maximum voltage adjustments according to one embodiment of the present disclosure.

While adjusting the slope adjustment value K of the isogain contour to provide the target supply voltage $V_t$ can thus be used to reduce or eliminate clipping, it comes at the cost of reduced efficiency due to the unnecessarily high headroom provided. Similar to the approach discussed above, FIG. 5 is a graph illustrating another way in which an isogain contour can be modified using both the slope adjustment value K and a maximum expected voltage $V_{cc(max)}$ to provide different target supply voltages $V_t$, where $V_{cc(max)}$ is an expected maximum voltage for the power envelope of an RF signal within a given period of time (e.g., a timeslot or signal transmission). By adjusting the isogain contour based on the expected maximum voltage $V_{cc(max)}$ and using the slope adjustment value K to compensate for delay, clipping may be avoided while slightly improving efficiency. However, there is still a large amount of unnecessary headroom provided.

The LUT 26 may be reprogrammed with a particular slope adjustment value K and/or expected maximum voltage $V_{cc(max)}$ to reduce clipping. However, it would be desirable to modulate the slope adjustment value K in real time to better track the actual power envelope of an RF signal. Referring back to FIG. 4B, it can be seen that while increasing the slope adjustment value K results in reduced and even eliminated clipping on each rising edge of the ideal envelope tracking supply voltage $V_{cc}$, larger slope adjustment values K result in even less accurate tracking on each falling edge of the ideal envelope tracking supply voltage $V_{cc}$, as there is significant overshoot. If the slope adjustment value K can be modulated continuously, accurate envelope tracking can be achieved as discussed below.

Figure 6:
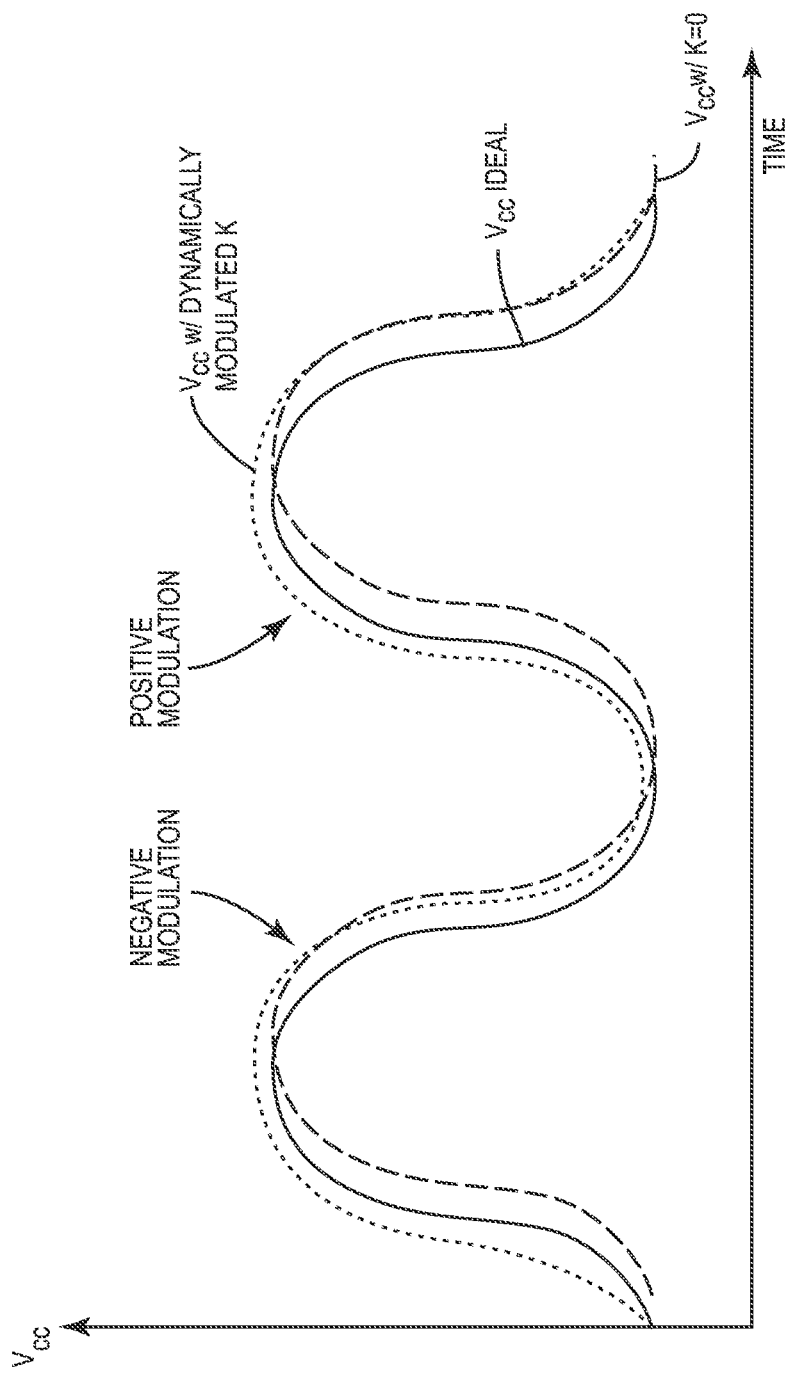
FIG. 6 is a graph illustrating an RF signal and corresponding envelope tracking supply voltages according to one embodiment of the present disclosure.

FIG. 6 is thus a graph illustrating the effect of dynamically modulating the slope adjustment value K according to one embodiment of the present disclosure. In particular, FIG. 6 once again shows an ideal envelope tracking supply voltage $V_{cc}$ (solid line) and an actual envelope tracking supply voltage $V_{cc}$ (dashed line) where the slope adjustment value K is zero. As shown, there is a significant delay between the ideal envelope tracking supply voltage $V_{cc}$ and the actual envelope tracking supply voltage $V_{cc}$, which will result in clipping on the rising edge thereof. An additional envelope tracking supply voltage $V_{cc}$ (dotted line) is shown where the slope adjustment value K is dynamically modulated. In particular, on the rising edge of the signal the slope adjustment value K is positively modulated, resulting in reduced slope of the isogain contour, and on the falling edge of the signal the slope adjustment value K is negatively modulated, resulting in an increased slope of the isogain contour. This effectively advances and delays the envelope tracking supply voltage $V_{cc}$, allowing it to accurately track the ideal response. As discussed in detail below, the slope adjustment value K can be dynamically modulated based on a measured delay between the envelope tracking supply voltage $V_{cc}$ and an actual power envelope of an RF signal.

Figure 7:
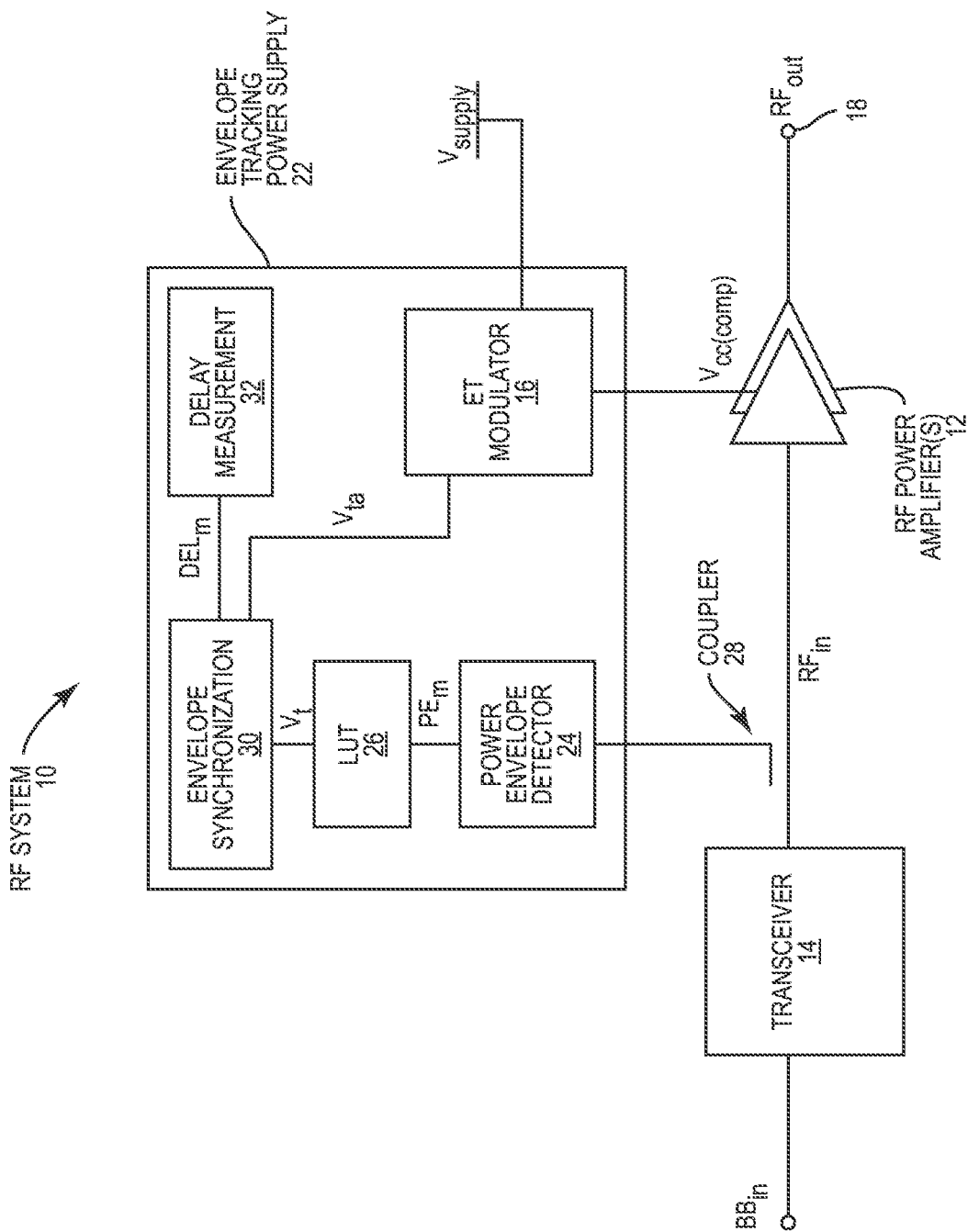
FIG. 7 is a functional schematic illustrating an RF system according to one embodiment of the present disclosure.

FIG. 7 shows the RF system 10 according to an additional embodiment of the present disclosure. The RF system 10 shown in FIG. 7 is substantially similar to that shown in FIG. 2, except that the envelope tracking power supply circuitry 22 further includes envelope synchronization circuitry 30 and delay measurement circuitry 32. The envelope synchronization circuitry 30 is coupled between the LUT 26 and the envelope tracking modulator circuitry 16. The delay measurement circuitry 32 is coupled to the envelope synchronization circuitry 30.

In operation, the power envelope detector circuitry 24 operates as discussed above to measure the power envelope of the RF input signal $RF_{in}$ and provide the power envelope measurement $PE_m$. The LUT 26 provides the target supply voltage $V_t$ based on the power envelope measurement $PE_m$. As discussed above, the LUT 26 may provide the target supply voltage $V_t$ according to an isogain contour for the one or more RF power amplifiers 12. The envelope synchronization circuitry 30 receives the target supply voltage $V_t$ and a delay measurement $DEL_m$ from the delay measurement circuitry 32, where the delay measurement $DEL_m$ is a measurement of the delay between the envelope tracking power supply signal $V_{cc}$ and the power envelope of the RF input signal $RF_{in}$. There are many ways to measure the delay between signals, including both analog and digital approaches, all of which are contemplated herein. The envelope synchronization circuitry 30 determines an appropriate slope adjustment value K based on the delay measurement $DEL_m$ and adjusts the target supply voltage $V_t$ based on the slope adjustment value K to provide an adjusted target supply voltage $V_{ta}$. As discussed above, the slope adjustment value K affects the slope of the isogain contour and thus adjusting the target supply voltage $V_t$ will effectively mean changing the slope or shape of the isogain contour from which the target supply voltage $V_t$ is provided (see, e.g., FIGS. 4B and 5). As discussed above, the envelope tracking modulator circuitry 16 modulates the supply voltage $V_{supply}$ according to the adjusted target supply voltage $V_{ta}$ to provide a compensated envelope tracking supply voltage $V_{cc(comp)}$. Notably, the envelope synchronization circuitry 30 operates continuously, adjusting the target supply voltage $V_t$ based on the delay measurement $DEL_m$ as it changes to provide the adjusted target supply voltage $V_{ta}$. This allows the compensated envelope tracking supply voltage $V_{cc(comp)}$ to be synchronized with the power envelope of the RF input signal.

Notably, the envelope tracking power supply circuitry 22 may be an integrated circuit, providing an envelope tracking integrated circuit (ETIC). All of the functionality relating to envelope tracking is provided in the envelope tracking power supply circuitry 22 as discussed above, thereby removing any specialized requirements for the transceiver circuitry 14 and aggregating the envelope tracking functionality in a single integrated circuit in some embodiments.

To better illustrate the concepts herein, Equation (1) expresses a compensated envelope tracking supply voltage $V_{cc(comp)}(t)$ as a function of an actual envelope tracking supply voltage $V_{cc}(t)$:

$$V_{cc(comp)}(t) = V_{cc}(t) + K(t) \times [V_{cc(max)} - V_{cc}(t)] \quad (1)$$

where, as discussed above, $V_{cc(max)}$ is the maximum expected voltage for the power envelope of an RF signal for a given period of time and $K(t)$ is the slope adjustment value. $V_{cc(max)}$ may be known ahead of time for a given period of time (e.g., a time slot or symbol) and, in the context of the envelope tracking power supply circuitry 22, may be looked up or otherwise estimated by the circuitry itself or communicated to the circuitry, for example, from the transceiver circuitry 14 via a communications mechanism such as an RF front end (RFFE) bus. Those skilled in the art will appreciate that the compensated envelope tracking supply voltage $V_{cc(comp)}(t)$ is directly related to the adjusted target supply voltage $V_{ta}$ by a gain applied by the envelope tracking modulation circuitry 16. The equations herein discuss the effect of the slope adjustment value $K(t)$ directly on the compensated envelope tracking supply voltage $V_{cc(comp)}(t)$ for the sake of simplicity. The slope adjustment value $K(t)$ can thus be expressed according to Equation (2):

$$K(t) = \frac{V_{cc(comp)} - V_{cc}(t)}{V_{cc(max)} - V_{cc}(t)} \quad (2)$$

As discussed above, the actual envelope tracking supply voltage $V_{cc}$ is related to an ideal envelope tracking supply voltage $V_{cc(ideal)}$ by a function of some delay dT, which may be equal to or otherwise related to the delay measurement $DEL_m$, according to Equation (3):

$$V_{cc}(t) = V_{cc(ideal)}(t - dT) \quad (3)$$

Ideally, the compensated envelope tracking supply voltage $V_{cc(comp)}$ will be equal to the ideal envelope tracking supply voltage $V_{cc(ideal)}$. Accordingly, $K(t)$ can be expressed as in Equation (4):

$$K(t) \cong \frac{V_{cc(ideal)}(t) - V_{cc}(t)}{V_{cc(max)}(t) - V_{cc}(t)} \quad (4)$$

since $V_{cc(ideal)}(t) = V_{cc}(t+dT)$, Equation (4) can be rewritten as Equation (5):

$$K(t) \cong \frac{V_{cc}(t+dT) - V_{cc}(t)}{V_{cc(max)} - V_{cc}(t)} = \frac{\Delta V_{cc_{dT}}(t)}{V_{cc(max)} - V_{cc}(t)} \quad (5)$$

assuming $V_{cc}(t+dT) - V_{cc}(t) \cong V_{cc}(t) - V_{cc}(t-dT)$, $K(t)$ can again be rewritten according to equation (6):

$$K(t) = \frac{V_{cc}(t) - V_{cc}(t-dT)}{V_{cc(max)} - V_{cc}(t)} \quad (6)$$

The compensated envelope tracking supply voltage $V_{cc(comp)}(t)$ can thus be rewritten according to Equation (7):

$$V_{cc(comp)}(t) = V_{cc}(t) + \frac{V_{cc}(t) - V_{cc}(t-dT)}{V_{cc(max)} - V_{cc}(t)} \times (V_{cc(max)} - V_{cc}(t)) \quad (7)$$

which can be rewritten as Equation (8):

$$V_{cc(comp)}(t) = V_{cc}(t) + (V_{cc}(t) - V_{cc}(t-dT)) = V_{cc}(t) + \Delta V_{cc_{dT}}(t) \quad (8)$$

where $\Delta V_{cc_{dT}}$ can be calculated directly as $V_{cc}(t) - V_{cc}(t-dT)$ or as a derivative $$\frac{dV_{cc}(t)}{dL} * dT.$$

As shown above the function of $K(t)$ is essentially to time advance or time delay the compensated envelope tracking supply voltage $V_{cc(comp)}(t)$ to compensate for delays and thus synchronize the compensated envelope tracking supply voltage $V_{cc(comp)}(t)$ with the ideal envelope tracking supply voltage $V_{cc(ideal)}(f)$ and thus the power envelope of an RF signal. $K(t)$ is a function of $\Delta V_{cc_{dT}}(t)$, where $\Delta V_{cc_{dT}}(t)$ may in some cases, i.e., those in which it is desired to time advance $V_{cc(comp)}(t)$, be a value of the envelope tracking supply voltage $V_{cc}(t)$ at some point in the future. Since it is not possible to actually predict the value of the envelope tracking supply voltage $V_{cc}(t)$ in the future, an estimation based on a relationship between the time advanced and time delayed version of $V_{cc}(t)$, i.e., $V_{cc}(t+dT) - V_{cc}(t) \cong V_{cc}(t) - V_{cc}(t-dT)$, may be used. However, this relationship may not be accurate in all circumstances. Accordingly, a derivative of $V_{cc}(t)$, e.g., $$\frac{dV_{cc}(t)}{dt} * dT,$$

may be used to estimate the value of $V_{cc}(t)$ in the future. In the case where $\Delta V_{cc_{dT}}(t)$ is estimated using a derivative, this may yield a value for $K(t)$ resulting in a compensated envelope tracking supply voltage $V_{cc(comp)}(t)$ that is too high with respect to the ideal envelope tracking supply voltage $V_{cc(idea)}(t)$, providing excessive headroom that reduces efficiency, or too low with respect to the ideal envelope tracking supply voltage $V_{cc(ideal)}(t)$, leading to compression and/or clipping. For example, using the derivative to calculate $\Delta V_{cc_{dT}}(t)$ can lead to constant undershoot or overshoot of $V_{cc(comp)}(t)$ with respect to $V_{cc(ideal)}(t)$ as well as undershooting $V_{cc(comp)}(t)$ near troughs in $V_{cc}(t)$ and overshooting $V_{cc(comp)}(t)$ near peaks in $V_{cc}(t)$. To compensate for this fact, Equation (1) can be rewritten as Equation (9):

$$V_{cc(comp)}(t) = V_{cc}(t) + K_{comp}(t) \times [V_{cc(max)} - V_{cc}(t)] \quad (9)$$

where $K_{comp}(t)$ is provided according to Equation (10):

$$K_{comp}(t) = K_{offset}(dT) + \frac{dV_{cc}}{dt} * dT * \frac{NLG\left(\frac{dV_{cc}(t)}{dt}\right)}{V_{cc(max)} - V_{cc}(t)} \quad (10)$$

where $K_{offset}(dT)$ is a constant offset value and NLG $$\left(\frac{dV_{cc}(t)}{dT}\right)$$

is a non-linear gain function. $K_{offset}(dT)$ provides a static level of compensation for constant error present in $K_{comp}(t)$ that results in a compensated envelope tracking supply voltage $V_{cc(comp)}(t)$ that is consistently above or below the ideal envelope tracking supply voltage $V_{cc(ideal)}(t)$ by some amount. $K_{offset}(dT)$ may be determined in a factory calibration process or pre-programmed.

$$NLG\left(\frac{dV_{cc}(t)}{dt}\right)$$

compensates for undershooting and overshooting at peaks and troughs of $V_{cc}(t)$ by applying a non-linear function to the derivative thereof, which may reduce gain near peaks and troughs in $V_{cc}(t)$. Those skilled in the art will appreciate that any suitable non-linear function can be used to compensate for the undershooting and overshooting discussed herein. Notably, the delay dT may be negative or positive in any of the above equations. $K_{comp}(t)$ can be broken down into a linear component and a non-linear component. The linear component $K_{comp(linear)}(t)$ is shown in Equation (11):

$$K_{comp(linear)}(t) = K_{offset}(dT) + \frac{dV_{cc}(t)}{dt} * \frac{dT}{V_{cc(max)} - V_{cc}(t)} \quad (11)$$

where $K_{comp}(t)$, including both the linear component and the non-linear component can be expressed according to Equation (12):

$$K_{comp}(t) = K_{comp(linear)}(t) * NLG\left(\frac{dV_{cc}(t)}{dt}\right) \quad (12)$$

In some embodiments, $K_{comp}(t)$ may always be a positive value, as shown in Equation (13):

$$K_{comp}(t) = \left| K_{offset}(dT) + \frac{dV_{cc}(t)}{dt} * dT * \frac{NLG\left(\frac{dV_{cc}(t)}{dt}\right)}{V_{cc(max)} - V_{cc}(t)} \right| \quad (13)$$

when $K_{comp}(t)$ is always a positive value as shown in Equation (13), the compensated envelope tracking supply voltage $V_{cc(comp)}$ may be "windowed" so that it can be either advanced or delayed with respect to the uncompensated envelope tracking supply voltage $V_{cc(actual)}$. The compensated envelope tracking supply voltage $V_{cc(comp)}$ will always be higher than the uncompensated envelope tracking supply voltage $V_{cc(actual)}$ to avoid clipping and thus distortion in the RF output signal $RF_{out}$.

Figure 8:
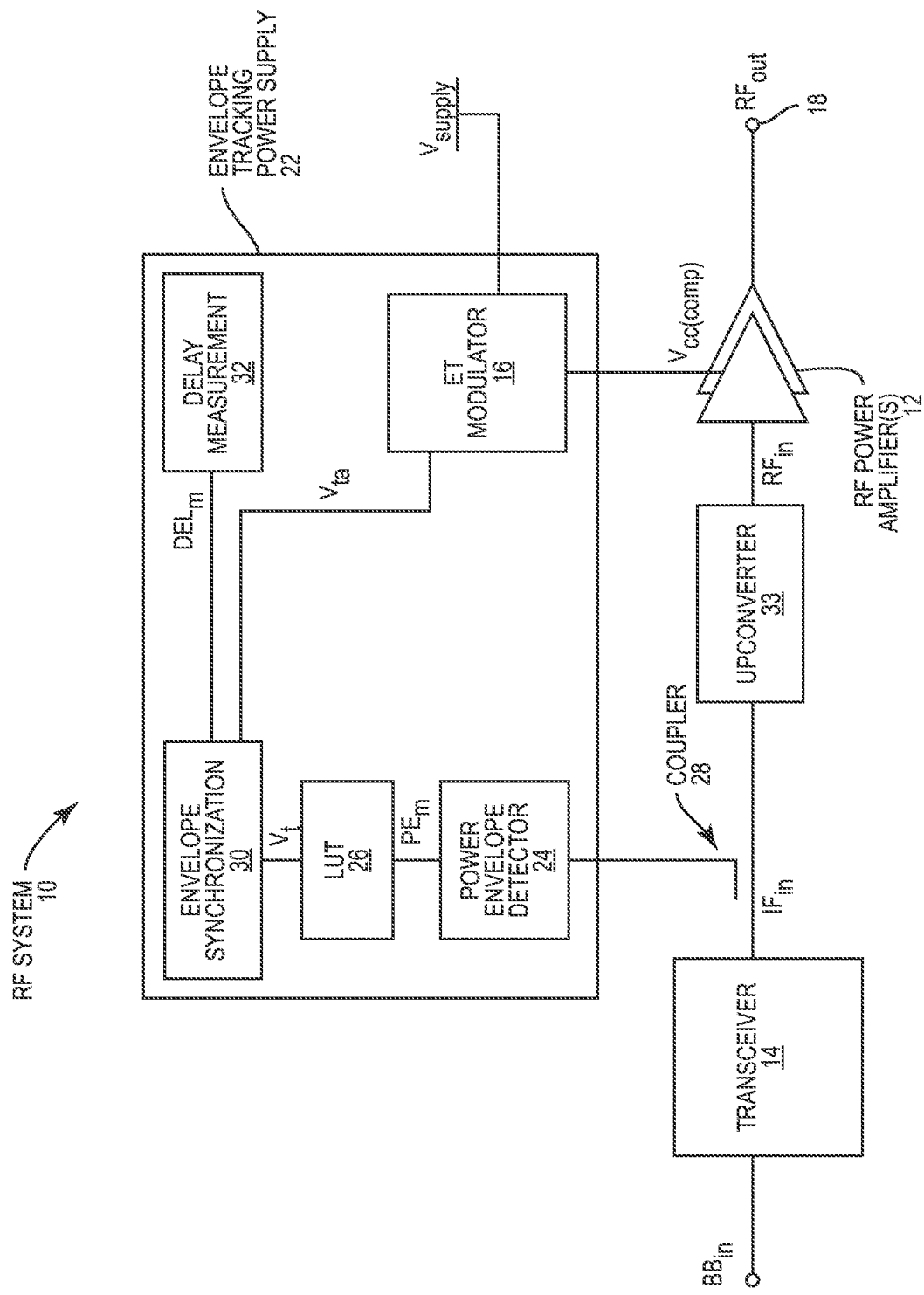
FIG. 8 is a functional schematic illustrating an RF system according to one embodiment of the present disclosure.

Notably, the RF system 10 shown in FIG. 7 may work similarly when the transceiver circuitry 14 provides an intermediate frequency (IF) input signal $IF_{in}$, such as in mmWave applications. Such an embodiment is shown in FIG. 8, which is substantially similar to FIG. 7 except that upconverter circuitry 33 is coupled between the transceiver circuitry 14 and the one or more RF power amplifiers 12. The upconverter circuitry 33 upconverts the IF input signal $IF_{in}$ to the RF input signal $RF_{in}$. As shown, the envelope tracking power supply circuitry 22 uses the IF input signal $IF_{in}$ to generate the compensated envelope tracking supply voltage $V_{cc(comp)}$, however, the coupler 28 could also be moved downstream from the upconverter circuitry 33 so that the RF input signal $RF_{in}$ is used instead.

Figure 9:
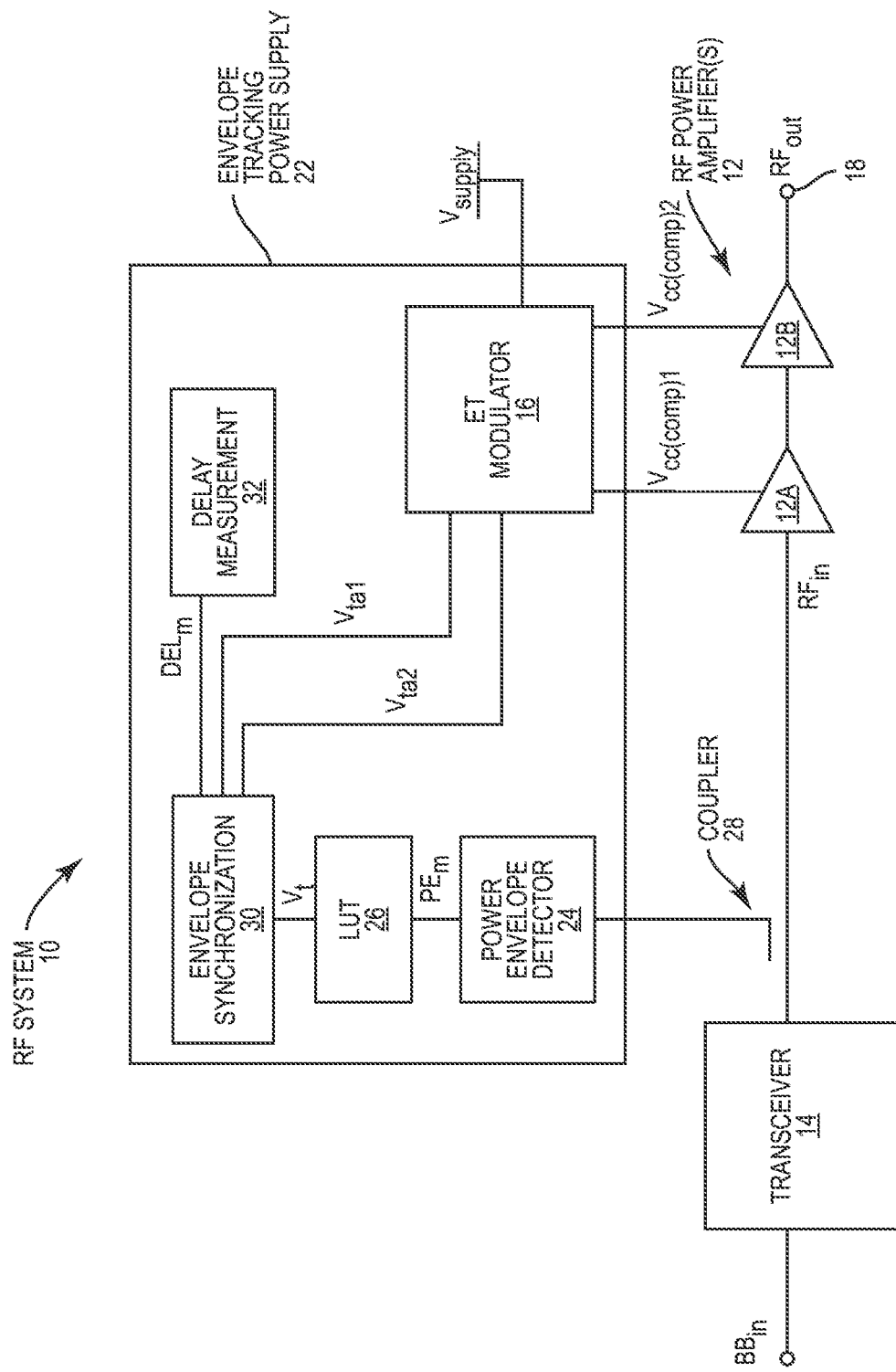
FIG. 9 is a functional schematic illustrating an RF system according to one embodiment of the present disclosure.

In some embodiments, the envelope tracking power supply circuitry 22 may be configured to provide a first compensated envelope tracking supply voltage $V_{cc(comp)1}$ to a first stage RF power amplifier 12A and provide a second compensated envelope tracking supply voltage $V_{cc(comp)2}$ to a second stage RF power amplifier 12B, as shown in FIG. 9. To do so, the envelope synchronization circuitry 30 may generate and provide a first adjusted target voltage $V_{ta1}$ and a second adjusted target voltage $V_{ta2}$ to the envelope tracking modulator circuitry 16, which modulates the supply voltage $V_{supply}$ based on the first adjusted target voltage $V_{ta1}$ to provide the first compensated envelope tracking supply voltage $V_{cc(comp)1}$ and modulates the supply voltage $V_{supply}$ based on the second adjusted target voltage $V_{ta2}$ to provide the second compensated envelope tracking supply voltage $V_{cc(comp)2}$. The first adjusted target voltage $V_{ta1}$ may be provided by adjusting the target voltage $V_t$ by a first amount while the second adjusted target voltage $V_{ta2}$ may be adjusted by a second amount. In particular, the time delay or time advance applied to the first adjusted target voltage $V_{ta1}$ may be different from the time delay or time advance applied to the second adjusted target voltage $V_{ta2}$. Synchronization of the second compensated envelope tracking supply voltage $V_{cc(comp)1}$ with the power envelope of the RF signal may be more critical to the operation of the RF system than synchronization of the first compensated envelope tracking supply voltage $V_{cc(comp)1}$, and thus the first adjusted target voltage $V_{ta1}$ and the second adjusted target voltage $V_{ta2}$ may be provided accordingly.

Figure 10:
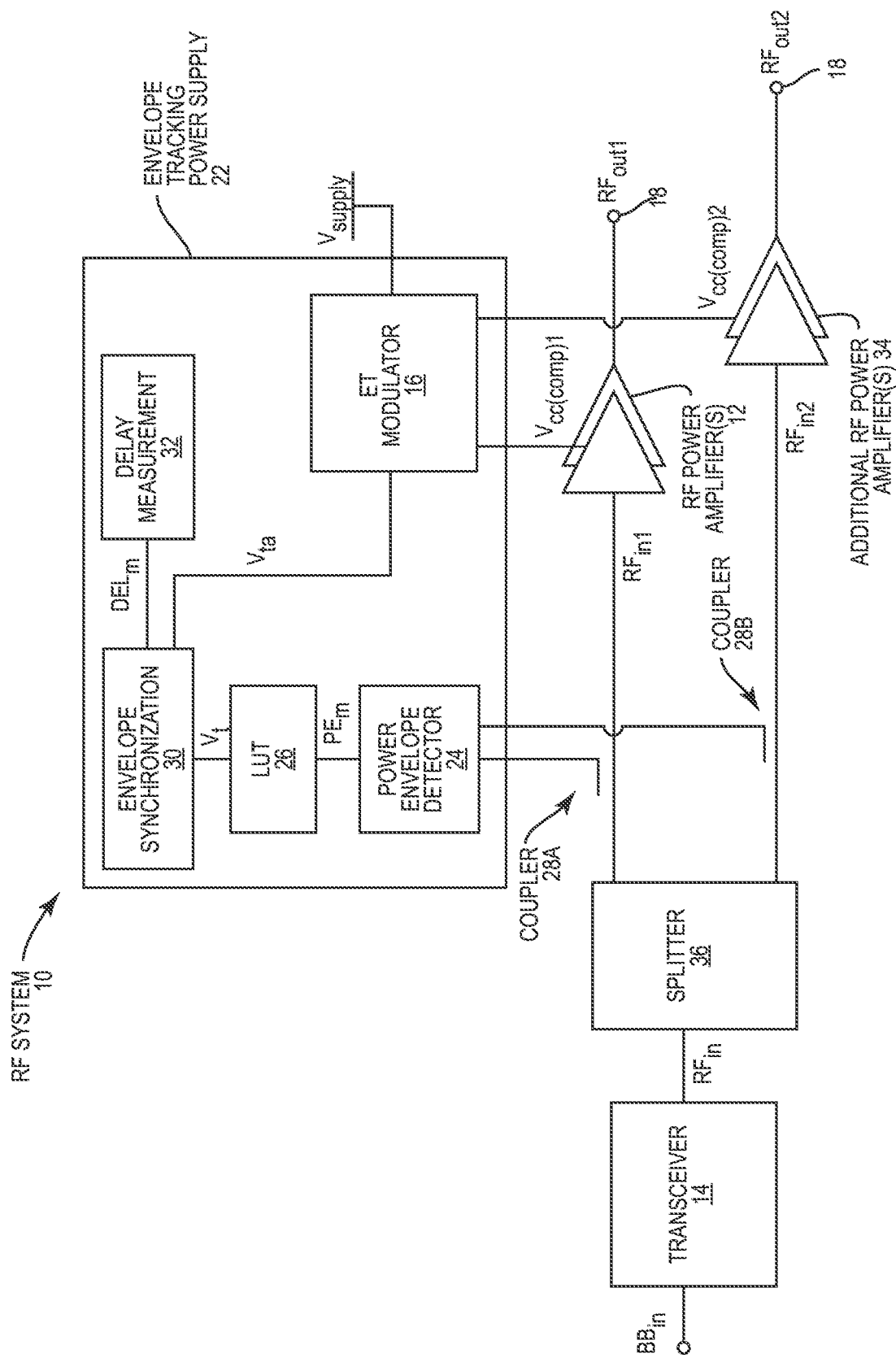
FIG. 10 is a functional schematic illustrating an RF system according to one embodiment of the present disclosure.

FIG. 10 shows the RF system 10 according to an additional embodiment of the present disclosure. The RF system 10 shown in FIG. 10 is substantially similar to that shown in FIG. 7, but further includes one or more additional RF power amplifiers 34 and splitter circuitry 36 coupled between the transceiver circuitry 14, the one or more RF power amplifiers 12, and the one or more additional RF power amplifiers 34. The splitter circuitry 36 is configured to split the RF input signal $RF_{in}$ into a first RF input signal $RF_{in1}$ and a second RF input signal $RF_{in2}$. The first RF input signal $RF_{in1}$ is amplified as discussed above with the one or more RF power amplifiers 12 using a first compensated envelope tracking supply voltage $V_{cc(comp)1}$ as discussed above to provide a first RF output signal $RF_{out1}$. The second RF input signal $RF_{in2}$ is similarly amplified using a second compensated envelope tracking supply voltage $V_{cc(comp)2}$ to provide a second RF output signal $RF_{out2}$. The coupler 28 may be split into a first coupler 28A for measuring the first RF input signal $RF_{in1}$ and a second coupler 28B for measuring the second RF input signal $RF_{in2}$.

Figure 11:
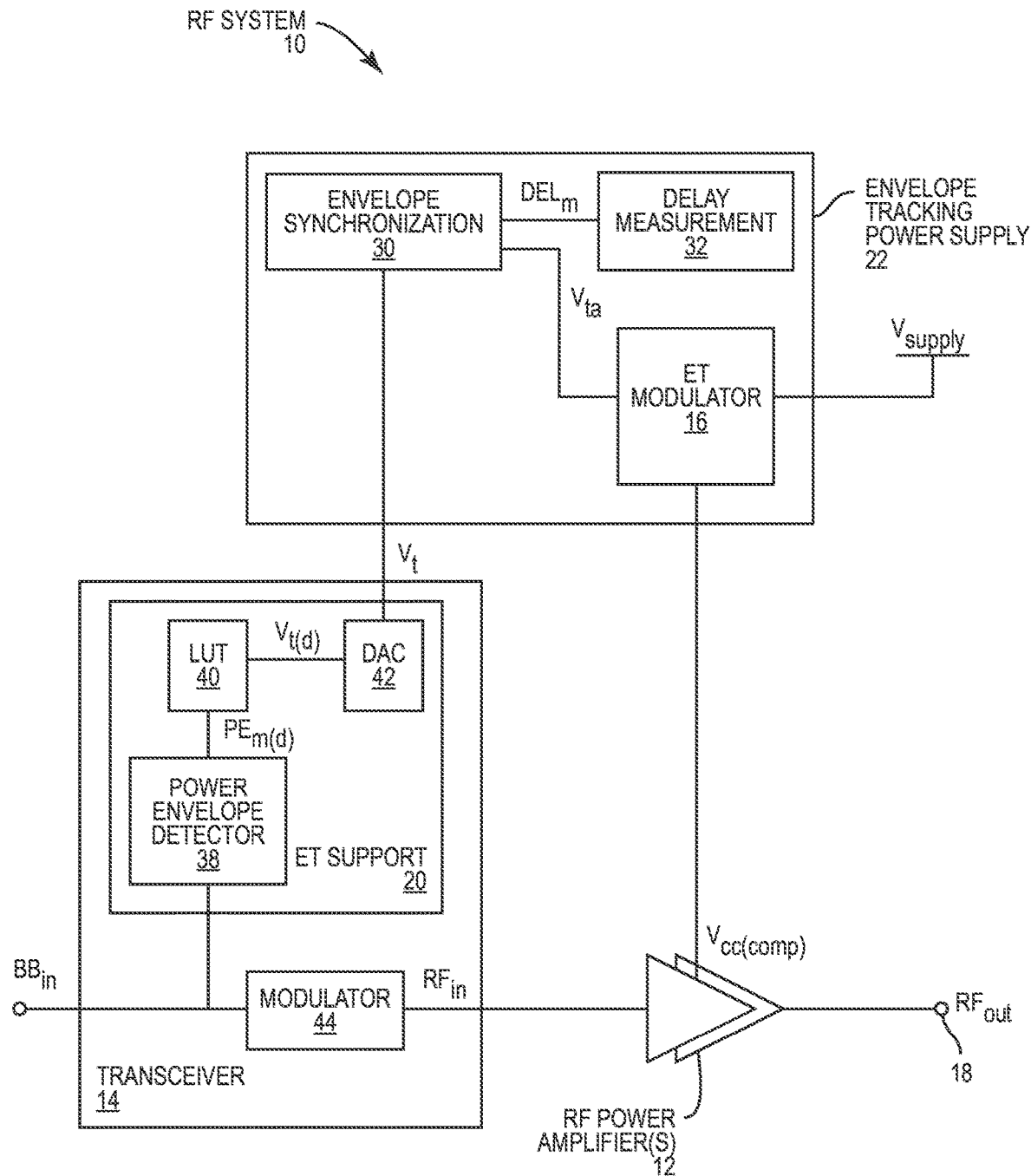
FIG. 11 is a functional schematic illustrating an RF system according to one embodiment of the present disclosure.

The envelope synchronization circuitry may be used in self-contained envelope tracking power supply circuitry 22 as shown above with respect to FIGS. 7-10, or may be used along with transceiver circuitry 14 including envelope tracking support circuitry 20. Accordingly FIG. 11 shows the RF system 10 according to an additional embodiment of the present disclosure, showing details of the envelope tracking support circuitry 20. As shown, the transceiver circuitry 14 includes envelope tracking support circuitry 20, which as discussed above with respect to FIG. 1 provides the target voltage $V_t$. In particular, the envelope tracking support circuitry 20 includes power envelope detector circuitry 38, a LUT 40, and digital to analog converter (DAC) circuitry 42. Also shown the transceiver circuitry 14 includes modulator circuitry 44, which receives the baseband input signal $BB_{in}$ and modulates the signal to provide the RF input signal $RF_{in}$. The power envelope detector circuitry 38 is configured to generate a digital power envelope measurement signal $PE_{m(d)}$ from the baseband input signal $BB_{in}$. The LUT 40 is configured to generate a digital target voltage $V_{t(d)}$ based on a look up of the digital power envelope measurement signal $PE_{m(d)}$. The DAC circuitry 42 is configured to convert the digital target voltage $V_{t(d)}$ to an analog signal, providing the target voltage $V_t$. The power envelope detector 24, the LUT 26, and the coupler 28 are omitted from the envelope tracking power supply circuitry 22, and the target voltage $V_t$ is provided directly to the envelope synchronization circuitry 30 from the envelope tracking support circuitry 20 in the transceiver circuitry 14. The envelope synchronization circuitry 30 operates in the same way described above to adjust the target voltage $V_t$, providing the adjusted target voltage $V_{ta}$ and thus synchronizing the compensated envelope tracking supply voltage $V_{cc(comp)}$ with the power envelope of the RF signal.

Figure 12:
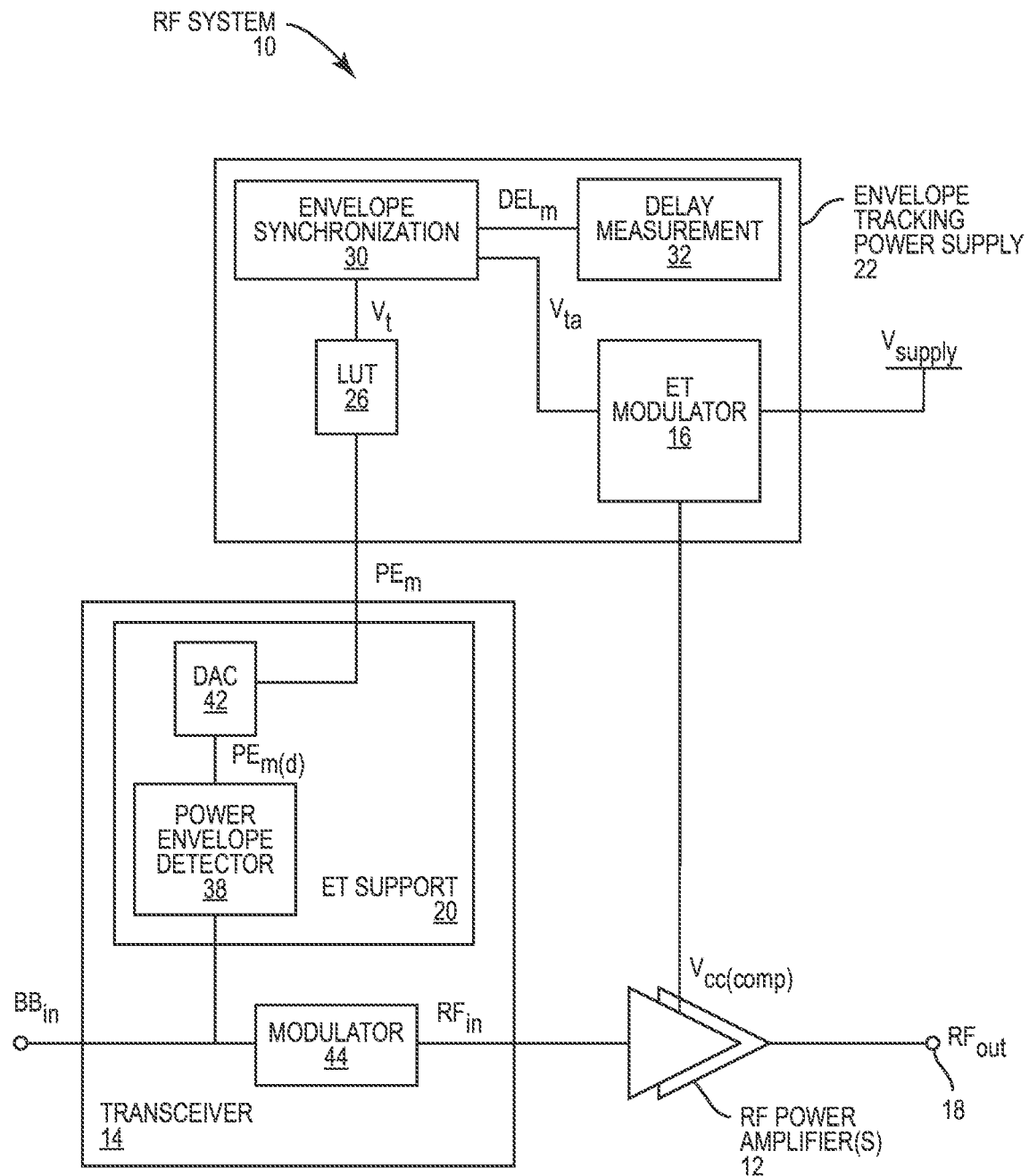
FIG. 12 is a functional schematic illustrating an RF system according to one embodiment of the present disclosure.

In another embodiment, the envelope tracking support circuitry 20 in the transceiver circuitry 14 may provide the power envelope measurement $PE_m$ instead of the target voltage as shown in FIG. 12. In such an embodiment, the LUT 40 is omitted from the envelope tracking support circuitry 20 and the digital power envelope measurement $PE_{m(d)}$ is provided to the DAC circuitry 42. The DAC circuitry 42 converts the digital power envelope measurement $PE_{m(d)}$ to an analog signal, providing the power envelope measurement signal $PE_m$ to the LUT 26 in the envelope tracking power supply circuitry 22. The LUT 26 will perform the same function described above to provide the target voltage $V_t$, for example, according to an isogain contour. The target voltage $V_t$ is adjusted by the envelope synchronization circuitry 30 as discussed above to provide the adjusted target supply voltage $V_{ta}$, which is used to provide the compensated envelope tracking supply voltage $V_{cc(comp)}$.

Figure 13:
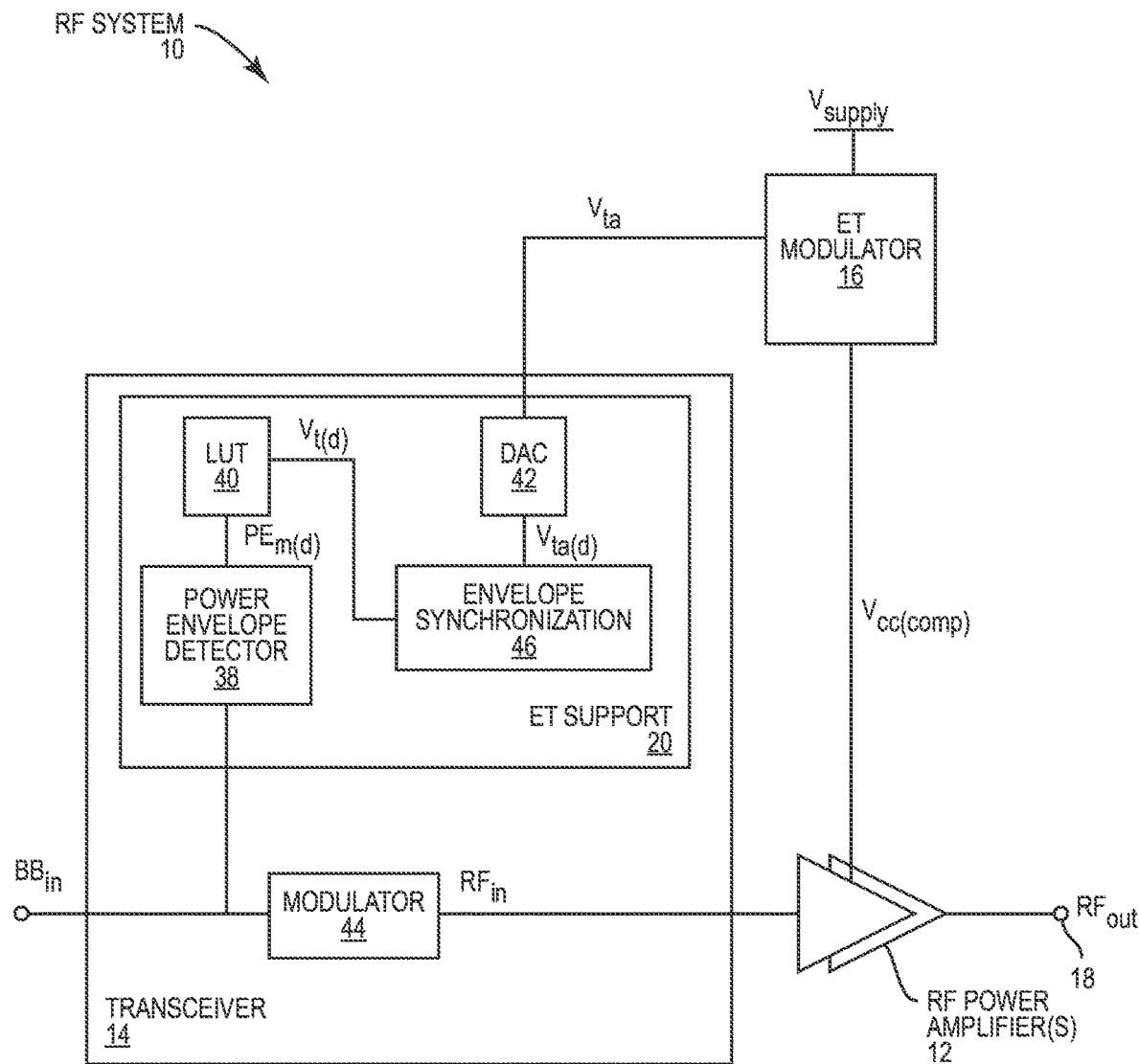
FIG. 13 is a functional schematic illustrating an RF system according to one embodiment of the present disclosure.

In yet another embodiment, the functionality of the envelope synchronization circuitry 30 may be implemented in the envelope tracking support circuitry 20 as shown in FIG. 13. In such an embodiment, the envelope tracking support circuitry 20 further includes envelope synchronization circuitry 46 between the LUT 40 and the DAC circuitry 42. The envelope synchronization circuitry 46 in the envelope tracking support circuitry 20 operates in the same manner as described above with respect to the envelope synchronization circuitry 30 in the envelope tracking power supply circuitry 22. However, the same operations may be performed in the digital domain rather than the analog domain. The envelope synchronization circuitry 46 thus receives the digital target voltage $V_{t(d)}$ and provides a digital adjusted target voltage $V_{ta(d)}$. The digital adjusted target voltage $V_{ta(d)}$ is provided to the DAC circuitry 42, where it is converted to an analog signal as the adjusted target voltage $V_{ta}$, which is provided directly to the envelope tracking modulator circuitry 16. The envelope tracking modulator circuitry 16 operates as described above to provide the compensated envelope tracking supply voltage $V_{cc(comp)}$ based on the adjusted target voltage $V_{ta}$.

In general, the synchronization techniques discussed herein can be implemented solely in the transceiver circuitry 14, solely in the envelope tracking power supply circuitry 22, or distributed across the transceiver circuitry 14, the envelope tracking power supply circuitry 22, or any other circuitry.

Figure 14:
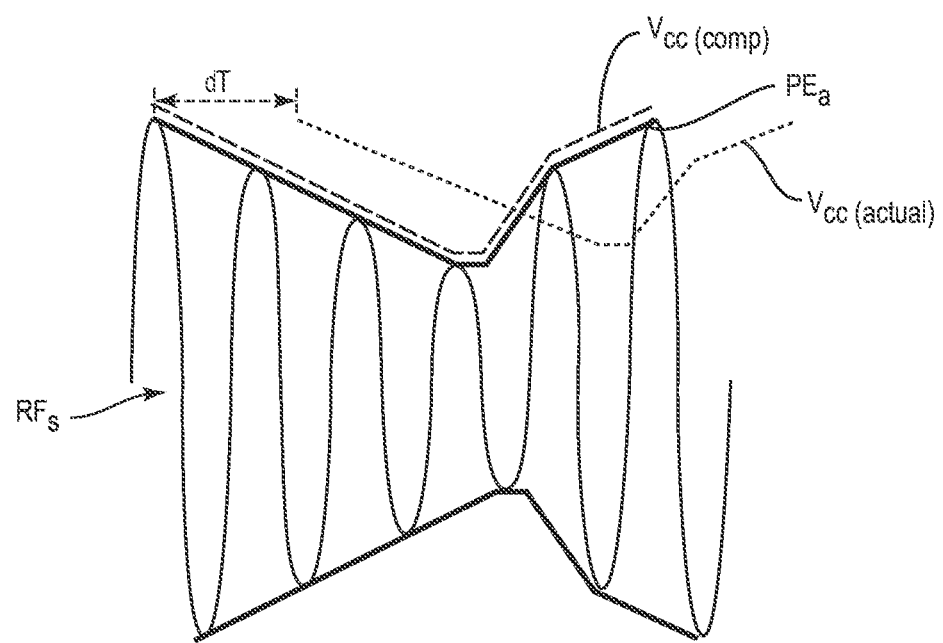
FIG. 14 is a graph illustrating an RF signal and corresponding envelope tracking supply voltages according to one embodiment of the present disclosure.

FIG. 14 is a graph illustrating an exemplary RF signal $RF_S$, an actual power envelope $PE_a$ of the exemplary RF signal $RF_S$, an uncompensated envelope tracking supply voltage $V_{cc(actual)}$, and a compensated envelope tracking supply voltage $V_{cc(comp)}$. As shown, the uncompensated envelope tracking supply voltage $V_{cc(actual)}$ is delayed with respect to the actual power envelope $PE_a$ of the exemplary RF signal $RF_S$ such that clipping results. The compensated envelope tracking supply voltage $V_{cc(comp)}$, which is generated according to the principles discussed herein, accurately tracks the actual power envelope $PE_a$ of the exemplary RF signal $RF_S$ with sufficient headroom to maintain linearity and efficiency. As shown, the compensated envelope tracking supply voltage $V_{cc(comp)}$ is effectively time-advanced with respect to the uncompensated envelope tracking supply voltage $V_{cc(actual)}$ by the time delay dT.

Figure 15:
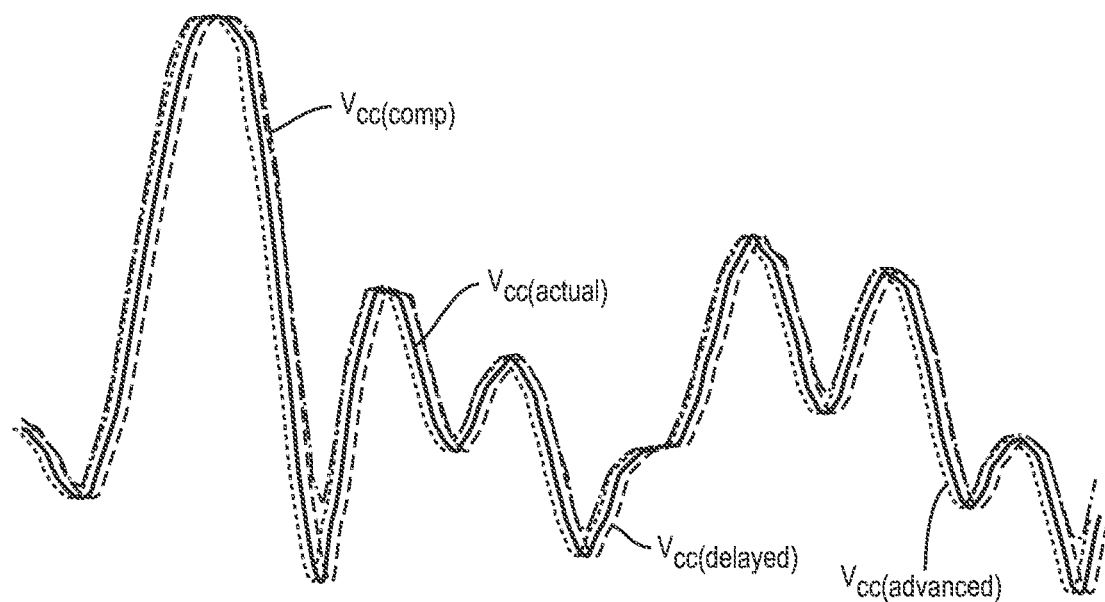
FIG. 15 is a graph illustrating a number of envelope tracking supply voltages according to one embodiment of the present disclosure.

As discussed above, the compensated envelope tracking supply voltage $V_{cc(comp)}$ may sometimes be time-advanced with respect to the uncompensated envelope tracking supply voltage $V_{cc(actual)}$, but also may be time-delayed with respect to the uncompensated envelope tracking supply voltage $V_{cc(actual)}$. FIG. 15 is a graph illustrating the uncompensated envelope tracking supply voltage $V_{cc(actual)}$, a time-advanced envelope tracking supply voltage $V_{cc(advanced)}$, and a time-delayed envelope tracking supply voltage $V_{cc(delayed)}$ The resulting compensated envelope tracking supply voltage $V_{cc(comp)}$ may be the maximum of the uncompensated envelope tracking supply voltage $V_{cc(actual)}$, the time-advanced envelope tracking supply voltage $V_{cc(advanced)}$, and the time-delayed envelope tracking supply voltage $V_{cc(delayed)}$. The equations discussed above provide the compensated envelope tracking supply voltage $V_{cc(comp)}$ to meet this criteria. However, the compensated envelope tracking supply voltage $V_{cc(comp)}$ may also be obtained by separately generating the time-advanced envelope tracking supply voltage $V_{cc(advanced)}$ and the time-delayed envelope tracking supply voltage $V_{cc(delayed)}$ according to the methods described above, then taking the maximum thereof.

Figure 16:
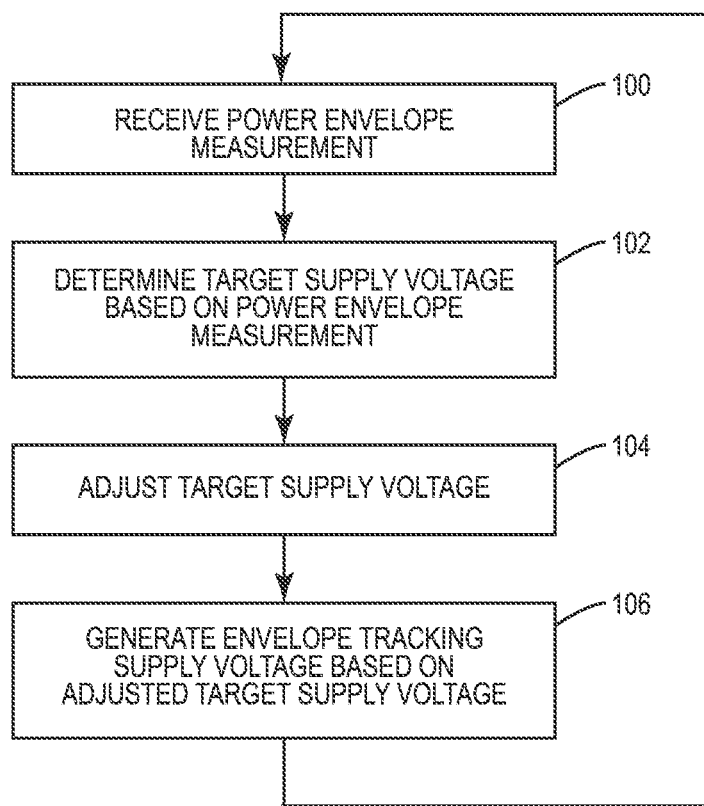
FIG. 16 is a flow diagram illustrating a method for operating an RF system according to one embodiment of the present disclosure.

FIG. 16 is a flow diagram illustrating a method for providing an envelope tracking supply voltage according to one embodiment of the present disclosure. First, a power envelope measurement is received (step 100). As discussed above, the power envelope measurement may be received via a coupler and measured by power envelope detector circuitry. Alternatively, the power envelope measurement may be performed digitally in transceiver circuitry. A target supply voltage is then determined based on the power envelope measurement (step 102). As discussed above, the target supply voltage may be determined based on a look up in a LUT, which may be provided according to an isogain contour for an RF power amplifier. Further as discussed above, the target supply voltage may be delayed with respect to an ideal supply voltage. Accordingly, the target supply voltage is adjusted based on a delay measurement (step 104), where the delay measurement indicates an amount of delay between the power envelope of an RF signal and the envelope tracking supply voltage. As discussed above, the target supply voltage may be adjusted by envelope synchronization circuitry. The envelope tracking supply voltage is then generated based on the adjusted target supply voltage (step 106), e.g., via envelope tracking modulator circuitry. Details regarding each of the steps, and, in particular, how the target supply voltage is adjusted to provide the adjusted target supply voltage, are discussed above (see, e.g., Equations 1-13).

Figure 17A:
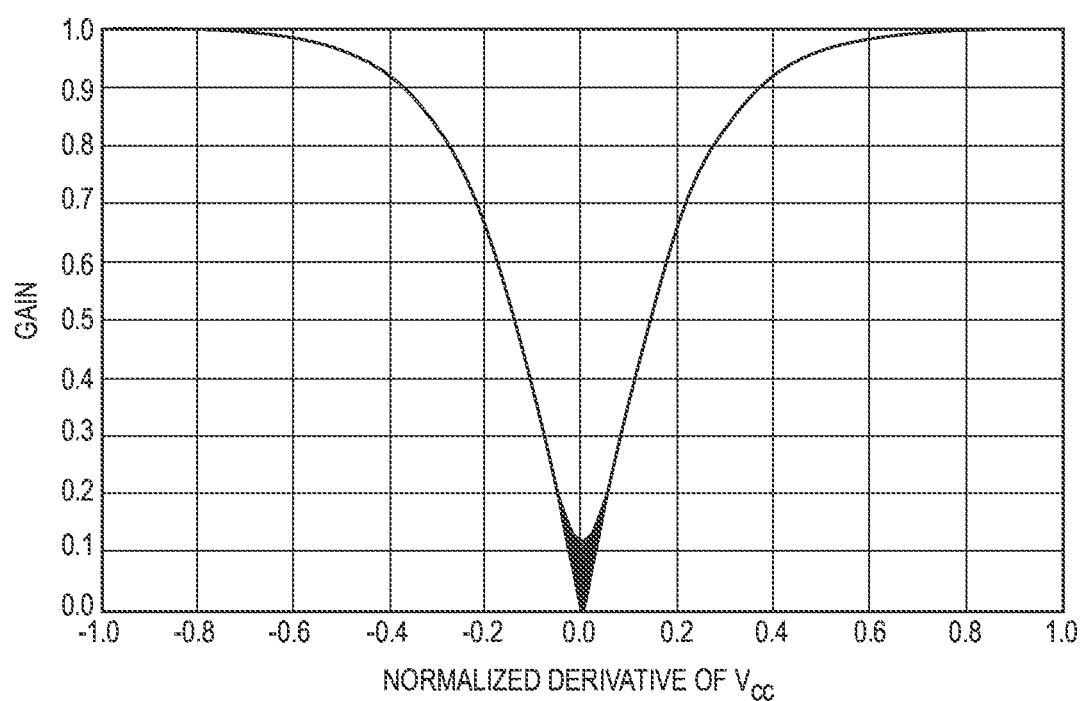
FIGS. 17A and 17B are graphs illustrating a non-linear function for use in an RF system according to various embodiments of the present disclosure.

As discussed above with respect to Equations 10, 12, and 13, a non-linear gain function is used so to prevent overshooting at peaks of $V_{cc(comp)}(t)$. In particular, NLG $$\left(\frac{dV_{cc}(t)}{dt}\right)$$

compensates for undershooting and overshooting at peaks and troughs of $V_{cc(comp)}(t)$ by applying a non-linear function to the derivative thereof, which may reduce gain near peaks and troughs in $V_{cc(comp)}(t)$. FIG. 17A is a graph illustrating one example of the non-linear gain function NLG $$\left(\frac{dV_{cc}(t)}{dt}\right).$$

Figure 17B:
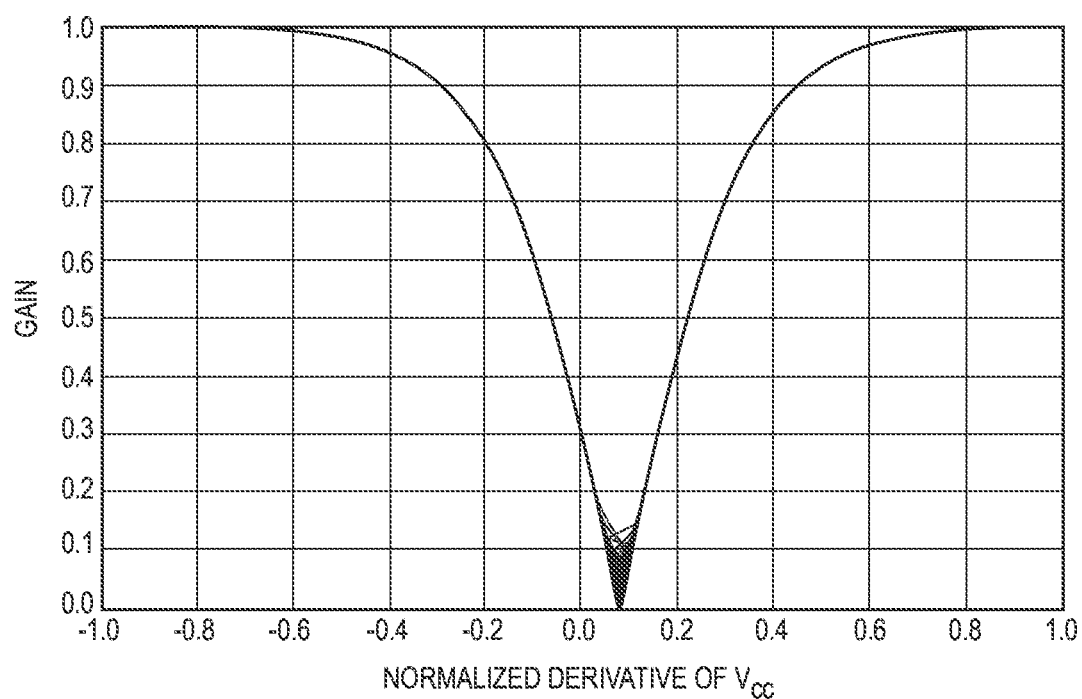

FIG. 17A shows a graph of gain vs a normalized derivative of $V_{cc}(t)$. The non-linear gain function can be expressed according to Equation (15):

$$NLG\left(\frac{dV_{cc}(t)}{dt}\right) = \left|\frac{\frac{dV_{cc}(t)}{dt}}{\frac{dV_{cc(max)}(t)}{dt} - N_{offset}} * N_{comp}\right| * 1.0 \quad (15)$$

where $N_{offset}$ is a static value that can be changed to offset where the valley in the function shown in FIG. 17A occurs and $N_{comp}$ is a static value that can be changed to determine how much non-linearity is applied. FIG. 17A shows the non-linear gain function with $N_{offset}=0$ and $N_{comp}=4$. Generally, overshooting at peaks of $V_{cc}(t)$ is much more of a problem than undershooting at valleys, and so it may be beneficial to provide the non-linear gain function as shown in FIG. 17B, wherein $N_{offset}=0.08$ and $N_{comp}=4$. As shown, the non-linear gain function is offset from zero so that more compensation is provided when the derivative is positive (approaching a peak) rather than negative (approaching a valley). This may further reduce overshooting at peaks of $V_{cc}(t)$. Those skilled in the art will appreciate that the non-linear gain function shown in FIGS. 17A and 17B and discussed above is one of many possibilities for reducing overshooting at peaks of $V_{cc(comp)}(t)$, and that the present disclosure contemplates the use of any and all non-linear gain functions for accomplishing these objectives.

As discussed above, the improvements to the envelope tracking power supply circuitry 22 discussed herein allow for a self-contained envelope tracking solution that requires no specialization of the transceiver circuitry 14. The transceiver circuitry 14, which may also be referred to as baseband circuitry or modem circuitry, is conventionally the control center of the RF system, communicating with various parts thereof via a serial bus, such as an RF front end (RFFE) bus to program the parts for timing and synchronization with slot and/or symbol boundaries or the like. Current trends in transceiver circuitry 14 continue to see increases in the complexity thereof, with additional functionality in the RF system being provided at least in part by the transceiver circuitry 14. Accordingly, the demands on the transceiver circuitry 14 continue to increase and may become difficult to satisfy in some scenarios.

Figure 18:
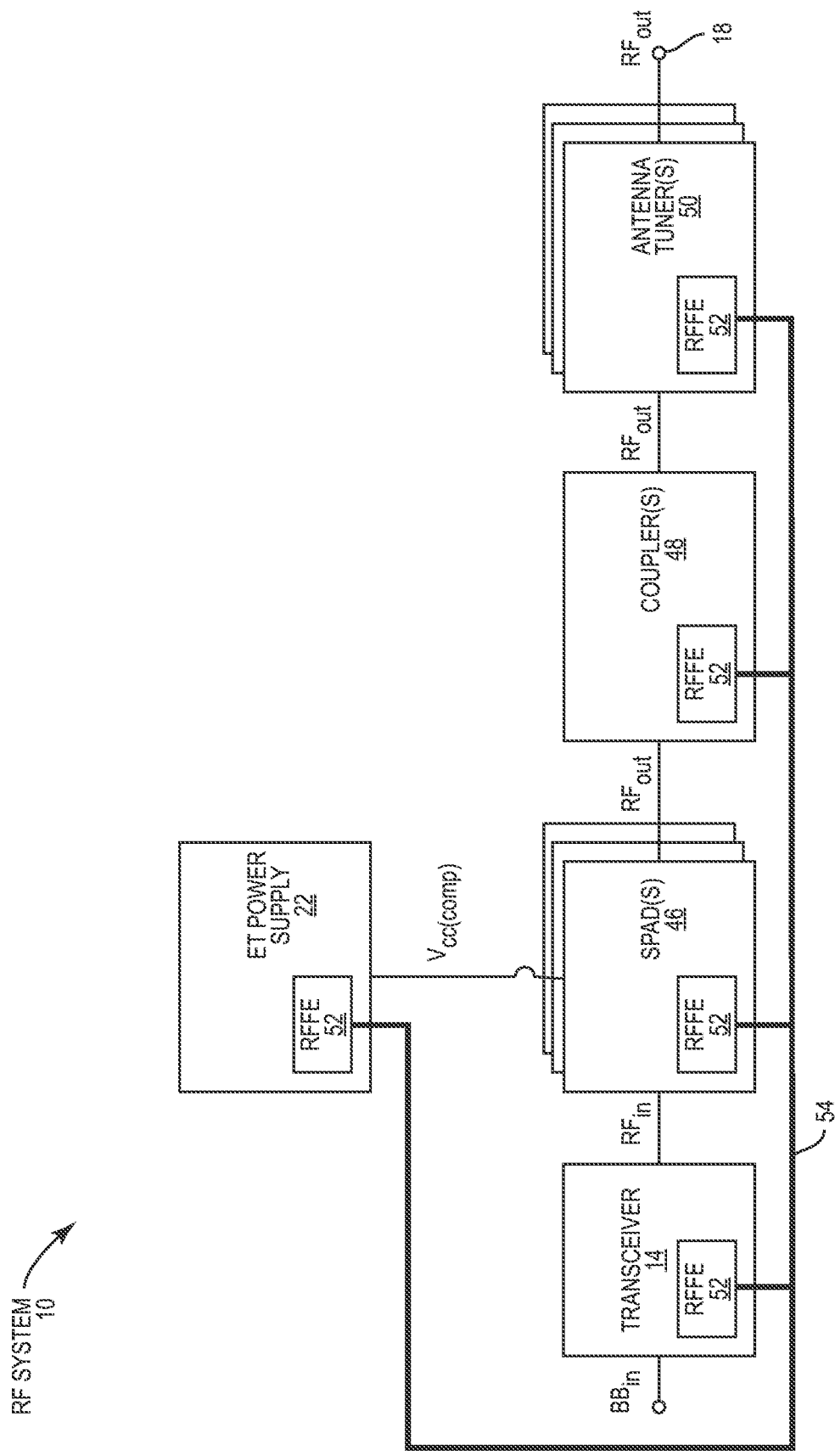
FIG. 18 is a functional schematic illustrating an RF system according to one embodiment of the present disclosure.

FIG. 18 shows the RF system 10 according to an additional embodiment of the present disclosure. In the RF system 10 shown in FIG. 18, the one or more RF power amplifiers 12 are shown as one or more splitter, power amplifier, duplexer (SPAD) blocks 46 coupled to the transceiver circuitry 14. As indicated by the name, each one of the SPAD blocks 46 may include one or more splitters, RF power amplifiers, and duplexers. The envelope tracking power supply circuitry 22 is coupled to each one of the SPAD blocks 46 to provide the compensated envelope tracking supply voltage $V_{Cc(comp)}$ as discussed above. Coupler circuitry 48 is coupled to the output of the one or more SPAD blocks 46. One or more antenna tuners 50 are coupled between the coupler circuitry 48 and the RF output. In operation, the one or more SPAD blocks 46 receive the RF input signal $RF_{in}$, which may be split into one or more sub-signals and amplified, before sending the amplified RF signals to the coupler circuitry 48. The coupler circuitry 48 may combine one or more separately amplified RF signals into a single RF output signal $RF_{out}$. The one or more antenna tuners 50 tune the impedance or other operating parameters of one or more connected antennas (not shown) for optimal transmission. The one or more SPAD blocks 46, the coupler circuitry 48, and the one or more antenna tuners 50 may be provided in what is referred to as an RF signal path. These and any other components in the RF signal path may be referred to as RF path components.

As shown, the transceiver circuitry 14 includes an RFFE bus connection 52 coupled to an RFFE bus 54. Each one of the envelope tracking power supply circuitry 22, the one or more SPAD blocks 46, the coupler circuitry 48, and the one or more antenna tuners 50 also includes an RFFE bus connection 52 coupled to the RFFE bus 54. The transceiver circuitry 14 communicates with the network to receive network information such as band or sub-band information, transmission modes of operation, modulation type and bandwidth, etc. The transceiver circuitry 14 uses this information to set one or more operating parameters of the one or more SPAD blocks 46, the coupler circuitry 48, and the one or more antenna tuners 50 by sending information via the RFFE bus 54. The transceiver circuitry 14 may also send relevant information to the envelope tracking power supply circuitry 22 via the RFFE bus 54, such as the maximum expected voltage for a given symbol or slot $V_{cc(max)}$ as discussed above, or any other relevant information that may then be used by the envelope tracking power supply circuitry 22 to generate the compensated envelope tracking supply voltage $V_{cc(comp)}$.

Figure 19:
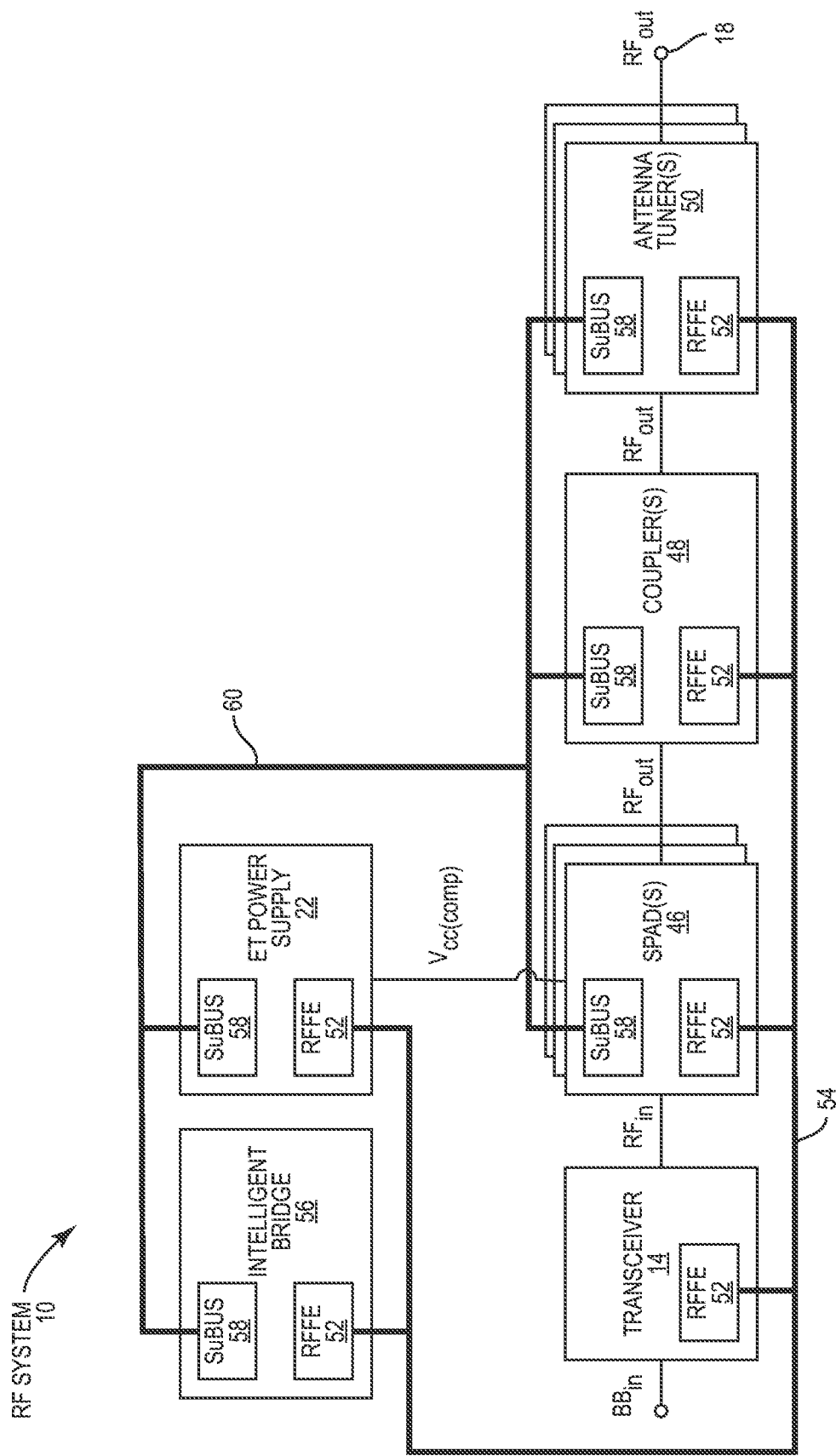
FIG. 19 is a functional schematic illustrating an RF system according to one embodiment of the present disclosure.

FIG. 19 shows the RF system 10 according to an additional embodiment of the present disclosure. The RF system 10 shown in FIG. 19 is substantially similar to that shown in FIG. 18, but further includes intelligent bridge circuitry 56. The intelligent bridge circuitry 56 includes an RFFE bus connection 52, and is coupled to the transceiver circuitry 14 via the RFFE bus 54. Further, the intelligent bridge circuitry 56 includes a secondary communications connection 58, such as one suitable for a single-wire communications bus (e.g., SμBUS). The secondary communications connection 58 is coupled to a secondary communications bus 60. Notably, each one of the envelope tracking power supply circuitry 22, the one or more SPAD blocks 46, the coupler circuitry 48, and the one or more antenna tuners 50 include a secondary communications connection 58 which is coupled to the secondary communications bus 60.

In operation, the transceiver circuitry 14 continues to operate as described above, communicating via the RFFE bus 54 to set one or more operating parameters of the one or more SPAD blocks 46, the coupler circuitry 48, the one or more antenna tuners 50, or any other circuitry not shown based on network operating conditions such as band or sub-band information, transmission modes of operation, modulation type and bandwidth, etc. The intelligent bridge circuitry 56 may separately communicate with the one or more SPAD blocks 46, the coupler circuitry 48, the one or more antenna tuners 50, the envelope tracking power supply circuitry 22, or any other circuitry via the secondary communications bus 60 in order to alter or set one or more operating parameters thereof based on other operating concerns such as envelope tracking modes of operation or the like. Providing the intelligent bridge circuitry 56 allows for the coordinated operation of the various components within the RF system 10 for additional modes of operation and/or improved performance without making any changes to the transceiver circuitry 14, and thus may be advantageous in some situations.

Figure 20:
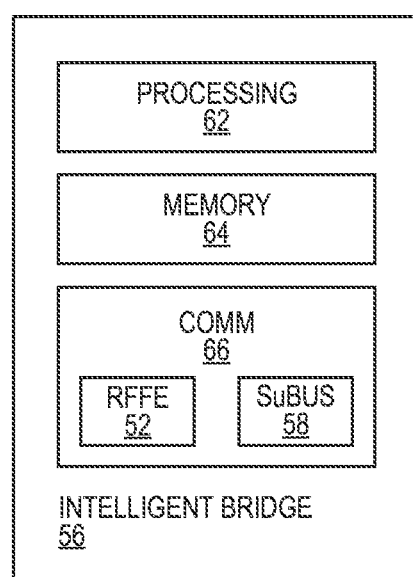
FIG. 20 is a functional schematic illustrating intelligent bridge circuitry according to one embodiment of the present disclosure.

FIG. 20 shows details of the intelligent bridge circuitry 56 according to one embodiment of the present disclosure. The intelligent bridge circuitry 56 includes processing circuitry 62, a memory 64, and communications circuitry 66. The memory 64 may store instructions, which, when executed by the processing circuitry 62 cause the intelligent bridge circuitry 56 to perform the functionality discussed above. The communications circuitry 66 may include several communications interfaces such as the RFFE connection 52 and the secondary communications connection 58. In certain embodiments, the intelligent bridge circuitry 56 may be integrated into the envelope tracking power supply circuitry 22.

Figure 21:
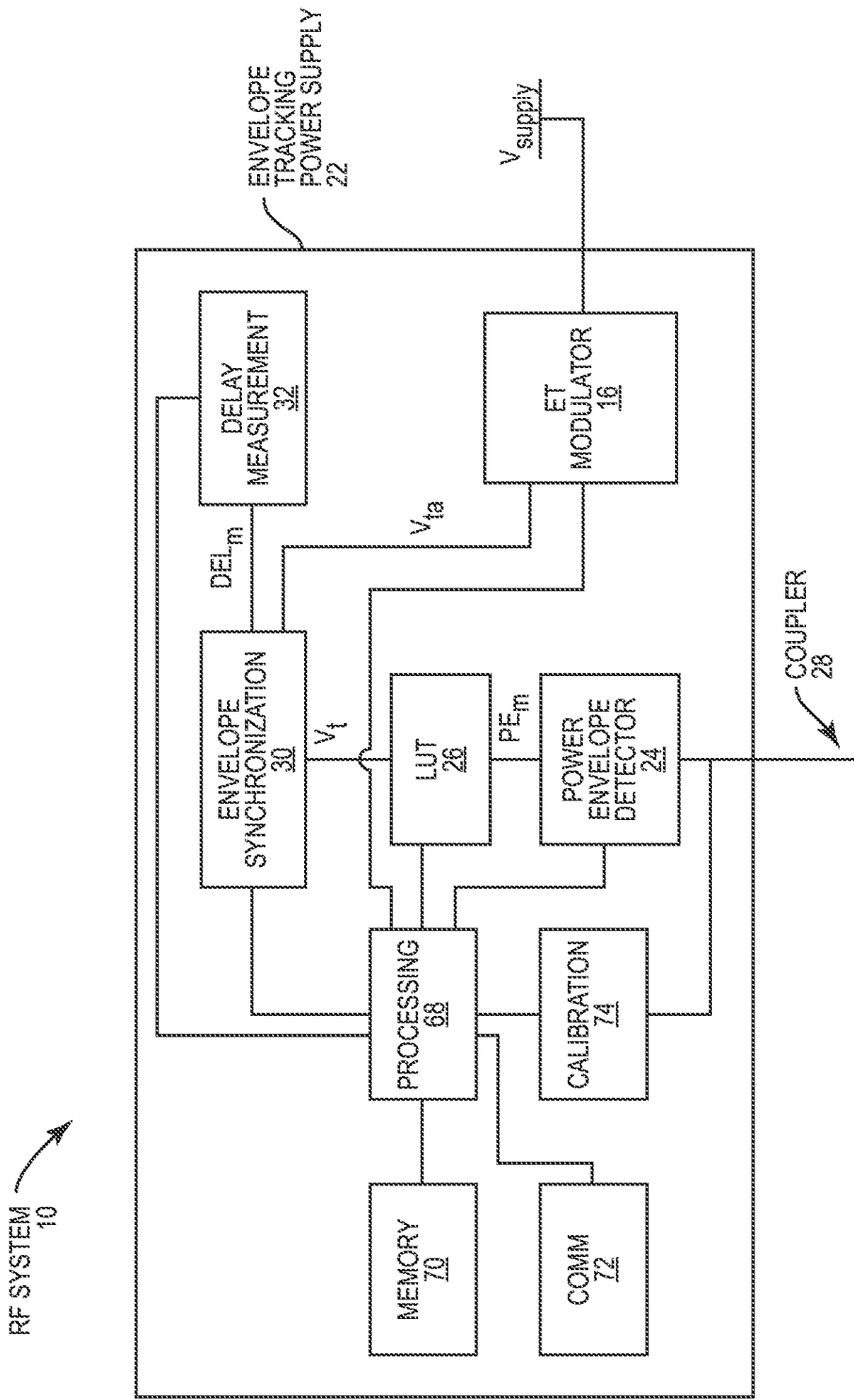
FIG. 21 is a functional schematic illustrating envelope tracking power supply circuitry according to one embodiment of the present disclosure.

FIG. 21 shows details of the envelope tracking power supply circuitry 22 according to one embodiment of the present disclosure. The envelope tracking power supply circuitry 22 is similar to that discussed above, but further includes processing circuitry 68, a memory 70, communications circuitry 72, and calibration circuitry 74. The processing circuitry 68 may be coupled to each functional block in the envelope tracking power supply circuitry 22 in order to coordinate the operation thereof. The memory 70 may store instructions, which, when executed by the processing circuitry 68, cause the envelope tracking circuitry 22 to provide the functionality discussed herein. The memory 70 may also store various tables and settings for different modes and bands of operations for the envelope tracking power supply circuitry 22, including look up tables for factory calibration and the like. The communications circuitry 72 may include any number of communications interfaces (e.g., for RFFE communications buses, single wire communications busses such as SµBUS, or the like) and thus may send and receive information to/from other devices in the RF system 10. The calibration circuitry 74 may be configured to locally generate an RF pulsed continuous wave (CW) signal or any other suitable calibration signal, which is injected into the path of the one or more RF power amplifiers 10 via the RF coupler 28. The response can then be measured (e.g., via measurement circuitry such as the RF coupler 28, an additional coupler not shown, or any other suitable circuitry) to generate the LUT 26 or any other operating parameters such that the calibration of the envelope tracking power supply circuitry 22 can be completely self-contained. The processing circuitry 68 may coordinate this calibration process. Notably, the envelope tracking power supply circuitry 22 shown in FIG. 21 may be used in any of the embodiments discussed herein.

While providing the compensated envelope tracking supply voltage $V_{cc(comp)}$ as described above results in synchronization with the power envelope of the RF signal, the adjustments made to the target supply voltage $V_t$ to accomplish this may mean that the adjusted target voltage $V_{ta}$ no longer tracks an isogain contour for the one or more RF power amplifiers 12. As discussed above, providing the target voltage $V_t$ and thus envelope tracking supply voltage $V_{cc}$ according to an isogain contour results in increased linearity and/or efficiency of the one or more RF power amplifiers 12. The deviations in the adjusted target voltage $V_{ta}$ from the isogain contour may result in distortion in the RF output signal $RF_{out}$.

Figure 22:
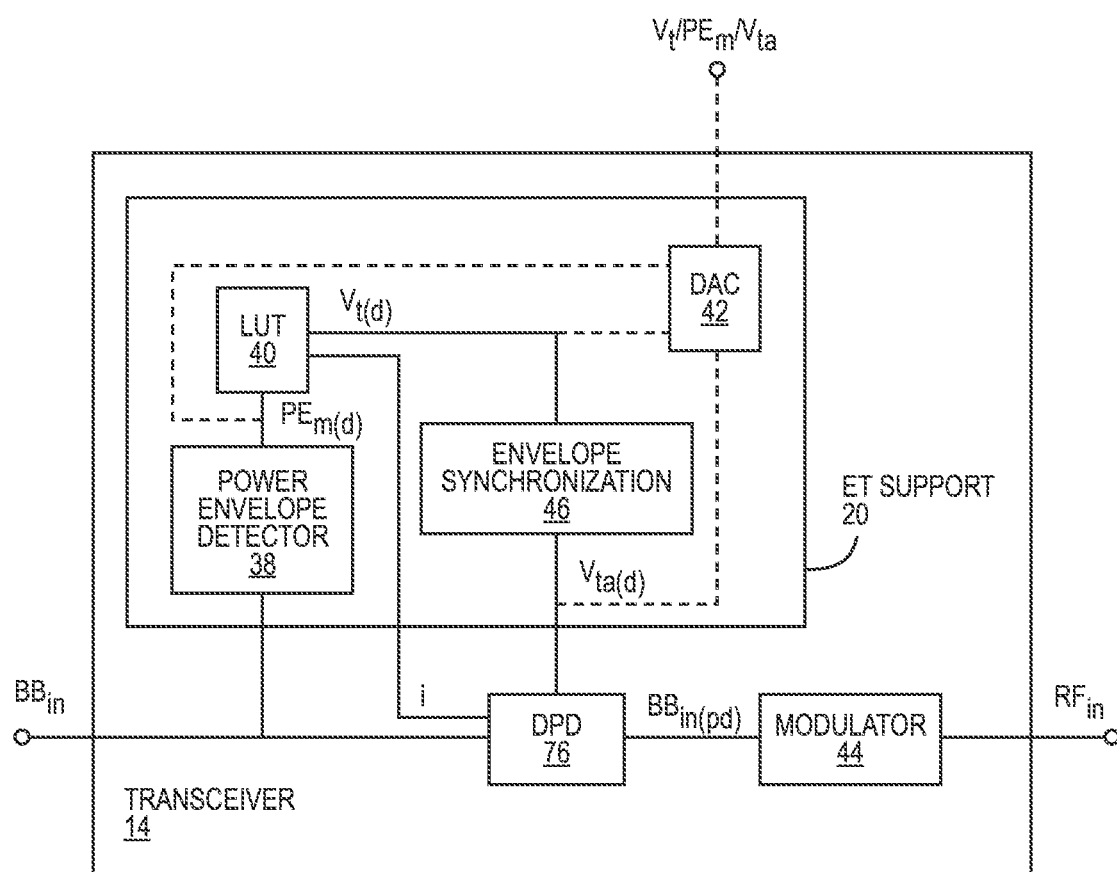
FIG. 22 is a functional schematic illustrating transceiver circuitry according to one embodiment of the present disclosure.

One way to solve this problem is by pre-distorting the RF input signal $RF_{in}$ to offset the effects of the adjusted target voltage $V_{ta}$ on the RF output signal $RF_{out}$. FIG. 22 thus shows the transceiver circuitry 14 according to one embodiment of the present disclosure. In addition to the parts discussed above, the transceiver circuitry 14 further includes digital predistortion (DPD) circuitry 76 coupled to the modulator circuitry 44. The DPD circuitry 76 provides some pre-distortion of the baseband input signal $BB_{in}$, which may be, for example, an in-phase/quadrature (I/Q) signal, to provide a pre-distorted baseband input signal $BB_{in(pd)}$. As shown, the DPD circuitry 76 may generate the pre-distorted baseband input signal $BB_{in(pd)}$ based on the digital adjusted target voltage $K_{ta(d)}$ and a signal indicative of the power envelope of the baseband input signal $BB_{in}$, which is shown in the present embodiment as an index i associated with the current value for the digital power envelope measurement $PE_{m(d)}$ in the LUT 40. Notably, the index i is only one exemplary input, and any signal indicative of the power envelope of the baseband input signal $BB_{in}$ may be used. The modulator 44 modulates the pre-distorted baseband input signal $BB_{in(pd)}$ to provide the RF input signal $RF_{in}$. The DAC circuitry 42 is shown optionally coupled to a number of different points in the envelope tracking support circuitry 20 such that it receives one of the digital target voltage $V_{t(d)}$, the digital power envelope measurement $PE_{m(d)}$, and the digital adjusted target voltage $V_{ta(d)}$ and converts the received signal to an analog signal to provide one of the target voltage $V_t$, the power envelope measurement $PE_m$, and the adjusted target voltage $V_{ta}$ to the envelope tracking power supply circuitry 22. Conventionally, the pre-distortion applied by the DPD circuitry 76 is used to offset the effects of using isogain to provide the target voltage $V_t$ on the RF output signal $RF_{out}$ (discussed in detail below). However, because the adjusted target voltage $V_{ta}$ no longer tracks the isogain contour for the one or more RF power amplifiers 12, there will be distortion in the RF output signal $RF_{out}$. Accordingly, the DPD circuitry 76 must provide additional pre-distortion on the baseband input signal $BB_{in}$.

The digital pre-distortion provided by the DPD circuitry 76 may be expressed according to Equation (16):

$$G_{dpd} = G_{dpd(isogain)} * G_{dpd(\Delta V_{cc})} \qquad (14)$$

where $G_{dpd}$ is the overall gain correction of the DPD circuitry 76, $G_{dpd(isogain)}$ is the gain correction of the DPD circuitry 76 configured to cancel distortion caused by the use of isogain with the one or more RF power amplifiers 12, and $G_{dpd(\Delta V_{cc})}$ is the gain correction of the DPD circuitry 76 configured to cancel the effect of the adjustments made to the adjusted target voltage $V_{ta}$ that cause deviations from the isogain contours for the one or more RF power amplifiers 12. Each of the gain correction terms discussed above is complex, including both amplitude and phase components.

Those skilled in the art will appreciate that $G_{dpd(isogain)}$ is conventionally the only gain correction provided by the DPD circuitry 76. The effect of $G_{dpd(isogain)}$ is to counter the distortion caused by the use of isogain with the one or more RF power amplifiers 12. Referring back to FIG. 4A, the isogain contours shown are not linear, meaning that as the magnitude of the power envelope of an RF signal increases, the target voltage $V_t$ increases according to the shape of the curve shown. This will cause distortion in the RF output signal $RF_{out}$, which can be cancelled by shaping the baseband input signal $BB_{in}$ in an opposite fashion. As discussed above, because the adjustments made to the adjusted target voltage $V_{ta}$ to synchronize the compensated envelope tracking supply voltage $V_{cc(comp)}$ with the power envelope of the RF signal, simply using $G_{dpd(isogain)}$ will no longer cancel the distortion in the RF output signal $RF_{out}$. Details of how $G_{dpd(isogain)}$ is provided will be appreciated by those skilled in the art and thus are not discussed herein.

Figure 23:
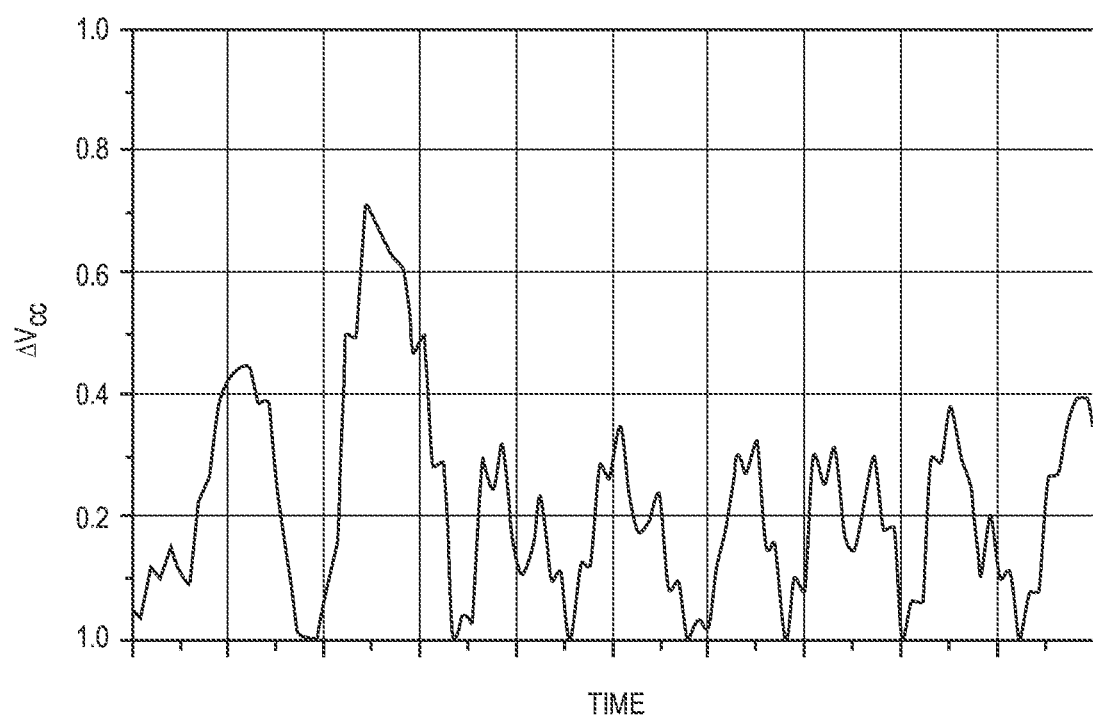
FIG. 23 is a graph illustrating a magnitude of adjustment of a target supply voltage according to one embodiment of the present disclosure.

FIG. 23 is a graph illustrating $\Delta V_{cc}$ over time for a given envelope tracking power supply signal, where $\Delta V_{cc}(t)=V_{ta}(t)-V_t(t)$, or the difference between the adjusted target voltage $V_{ta}$ and the target voltage $V_t$. As shown, $\Delta V_{cc}$ varies between 0 and 1 over time, and is indicative of the amount of deviation from the isogain curve that is occurring at any moment.

Figure 24:
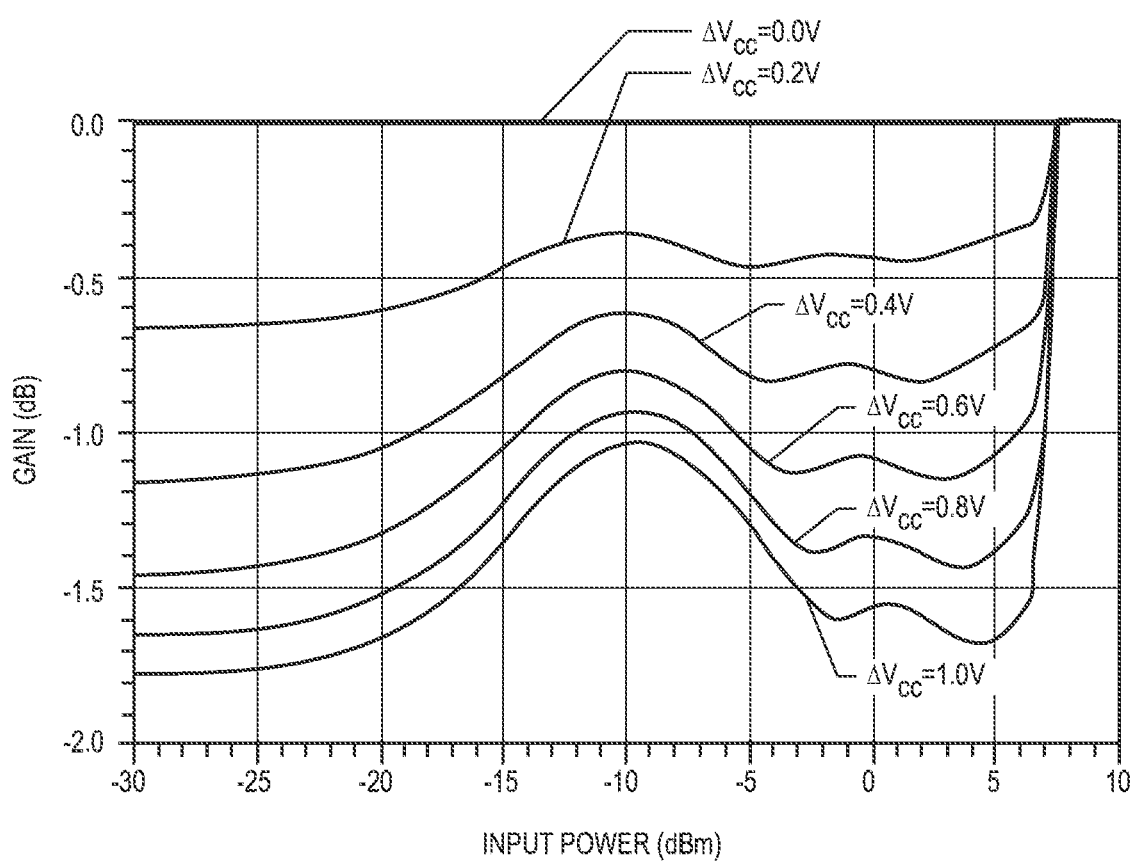
FIG. 24 is a graph illustrating a gain correction adjustment value to be used in an RF system according to one embodiment of the present disclosure.

FIG. 24 is a graph illustrating an amplitude correction component for $G_{dpd(\Delta V_{cc})}$ according to one embodiment of the present disclosure. The graph shows a relationship between gain applied and input power of the baseband input signal $BB_{in}$. Notably, several gain curves are illustrated, each of which represents a different $\Delta V_{cc}$ value, where $\Delta V_{cc}(t)=V_{ta}(t)-V_t(t)$. Depending on the difference between the adjusted target voltage $V_{ta}$ and the target voltage $V_t$ at a given time, the gain curve used for $G_{dpd(\Delta V_{cc})}$ will be chosen as shown. The amplitude correction portion of $G_{dpd(\Delta V_{cc})}$ can be expressed as a linear term, a second order equation, or a third order equation, depending on a desired system complexity and accuracy of gain correction, as shown in Equations (17), (18), and (19), respectively:

$$\text{Gain}_{\Delta V_{cc}}(i,\Delta V_{cc})=a(i)*\Delta V_{cc} \quad (17)$$

$$\text{Gain}_{\Delta V_{cc}}(i,\Delta V_{cc})=a(i)*\Delta V_{cc}+b(i)*\Delta V_{cc}^2 \quad (18)$$

$$\text{Gain}_{\Delta V_{cc}}(i,\Delta V_{cc})=a(i)*\Delta V_{cc}+b(i)*V_{cc}^2+c(i)*\Delta V_{cc}^2 \quad (19)$$

where a(i), b(i), and c(i) are polynomial coefficients that can be pre-programmed (e.g., by the characterization of a number of RF systems 10) or extracted during calibration of each RF system 10. In some embodiments, the polynomial coefficients may be stored in a LUT. While the amplitude correction function is shown as being dependent on the index value i from the LUT 40, which as discussed above is indicative of the power envelope of the baseband input signal $BB_{in}$, any signal indicative of the power envelope of the baseband input signal $BB_{in}$ could be used in place of the index value i.

Figure 25:
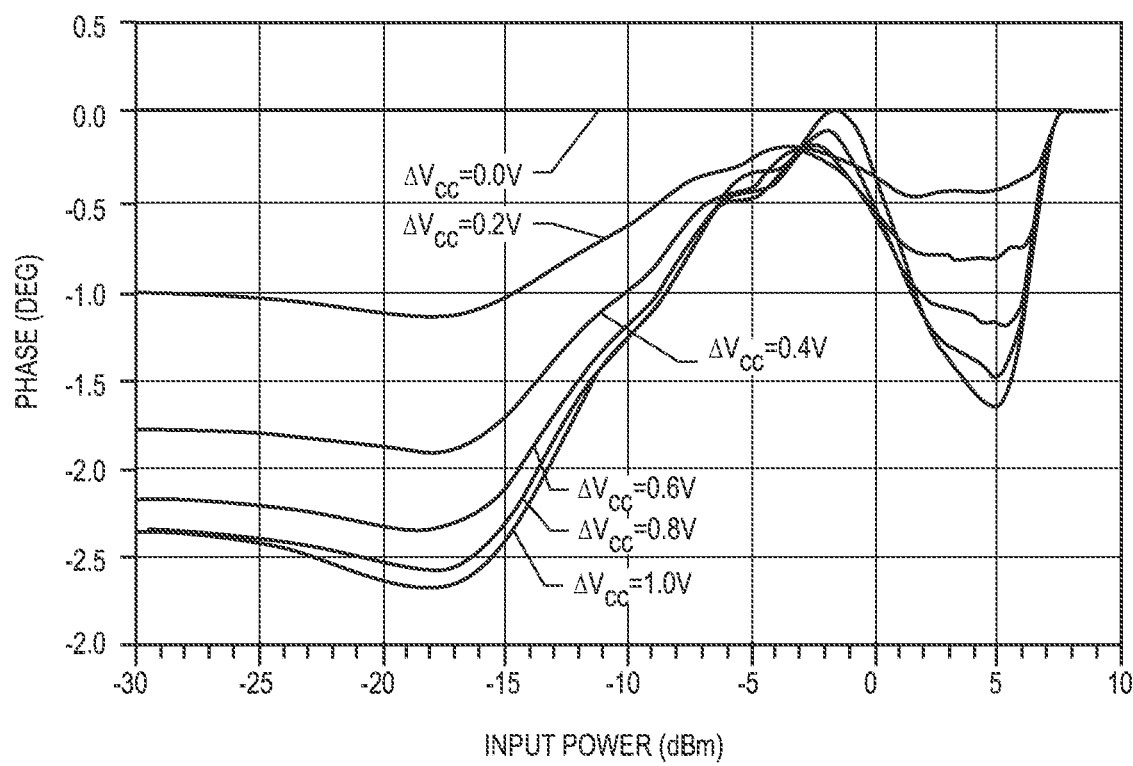
FIG. 25 is a graph illustrating a phase adjustment value to be used in an RF system according to one embodiment of the present disclosure.

FIG. 25 is a graph illustrating a phase correction component for $G_{dpd(\Delta V_{cc})}$ according to one embodiment of the present disclosure. The graph shows a relationship between phase rotation and input power of the baseband input signal $BB_{in}$. Notably, several phase correction curves are illustrated, each of which represents a different $\Delta V_{cc}$ value, where $\Delta V_{cc}(t)=V_{ta}(t)-V_t(t)$. Depending on the difference between the adjusted target voltage $V_{ta}$ and the target voltage $V_t$ at a given time, the phase correction curve used for $G_{dpd(\Delta V_{cc})}$ will be chosen as shown. The phase correction portion of $G_{dpd(\Delta V_{cc})}$ can be expressed as a linear term, a second order equation, or a third order equation, depending on a desired system complexity and accuracy of phase correction, as shown in Equations (20), (21), and (22), respectively:

$$\text{Phase}_{\Delta V_{cc}}(i,\Delta V_{cc})=d(i)*\Delta V_{cc} \quad (20)$$

$$\text{Phase}_{\Delta V_{cc}}(i,\Delta V_{cc})=d(i)*\Delta V_{cc}+e(i)*\Delta V_{cc}^2 \quad (21)$$

$$\text{Phase}_{\Delta V_{cc}}(i,\Delta V_{cc})=d(i)*\Delta V_{cc}+e(i)*\Delta V_{cc}^2+f(i)*\Delta V_{cc}^2 \quad (22)$$

where d(i), e(i), and f(i) are polynomial coefficients that can be pre-programmed (e.g., by the characterization of a number of RF systems 10) or extracted during calibration of each RF system 10. In some embodiments, the polynomial coefficients may be stored in a LUT. While the phase correction function is shown as being dependent on the index value i from the LUT 40, which as discussed above is indicative of the power envelope of the baseband input signal $BB_{in}$, any signal indicative of the power envelope of the baseband input signal $BB_{in}$ could be used in place of the index value i.

Figure 26:
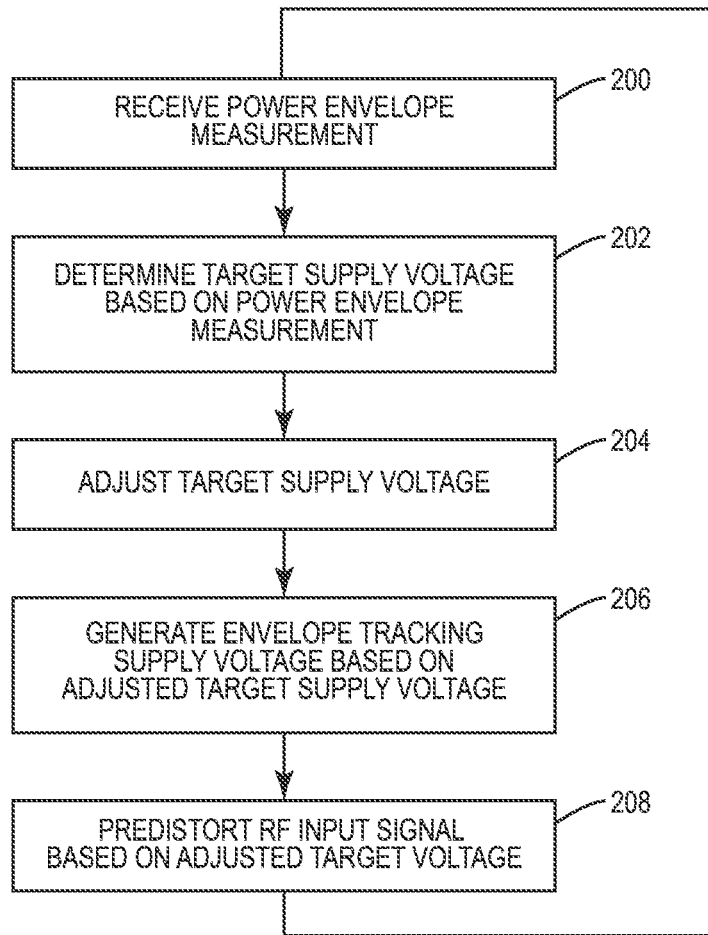
FIG. 26 is a flow diagram illustrating a method for operating an RF system according to one embodiment of the present disclosure.

In general, the present disclosure contemplates generating predistortion for an RF input signal $RF_{in}$ based on an adjusted target voltage $V_{ta}$ which has been adjusted to be synchronized in time with the power envelope of an RF signal. The foregoing discussion shows an exemplary way to accomplish this task, but any suitable systems and methods may be used to accomplish these objectives. FIG. 26 is a flow diagram illustrating a method for operating an RF system 10 according to one embodiment of the present disclosure. First, a power envelope measurement is received (step 200). As discussed above, the power envelope measurement may be received via a coupler and measured by power envelope detector circuitry. Alternatively, the power envelope measurement may be performed digitally in transceiver circuitry. A target supply voltage is then determined based on the power envelope measurement (step 202). As discussed above, the target supply voltage may be determined based on a look up in a LUT, which may be provided according to an isogain contour for an RF power amplifier. Further as discussed above, the target supply voltage may be delayed with respect to an ideal supply voltage. Accordingly, the target supply voltage is adjusted based on a delay measurement (step 204), where the delay measurement indicates an amount of delay between the power envelope of an RF signal and the envelope tracking supply voltage. As discussed above, the target supply voltage may be adjusted by envelope synchronization circuitry. The envelope tracking supply voltage is then generated based on the adjusted target supply voltage (step 206), e.g., via envelope tracking modulator circuitry. Details regarding each of the steps, and in particular how the target supply voltage is adjusted to provide the adjusted target supply voltage, are discussed above (see, e.g., Equations 1-13). In addition to the above, an RF input signal may be pre-distorted (e.g., digitally by DPD circuitry) to cancel the effect of adjusting the target supply voltage on the RF output signal (step 208). This may be accomplished as described above.

Figure 27:
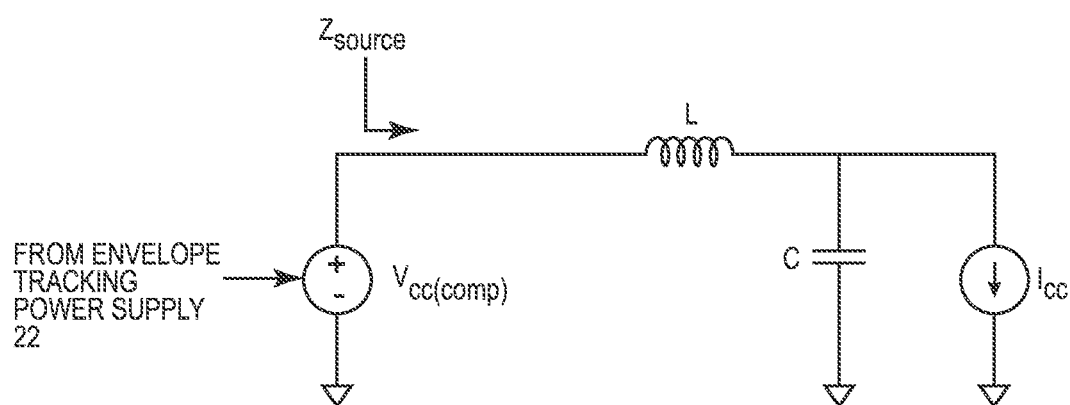
FIG. 27 is a functional schematic illustrating an equivalent circuit for one or more RF power amplifiers according to one embodiment of the present disclosure.

The discussion up to this point has neglected the effects of the impedance presented to the envelope tracking power supply circuitry 22 from the one or more RF power amplifiers 12 on the compensated envelope tracking supply voltage $V_{cc(comp)}$. However, those skilled in the art will appreciate that the one or more RF power amplifiers 12 present an impedance to the envelope tracking power supply circuitry 22 that may affect the operation thereof. FIG. 27 illustrates an equivalent circuit for the one or more RF power amplifiers 12 according to one embodiment of the present disclosure. As shown, the one or more RF power amplifiers 12 can be represented by a voltage source, which provides the compensated envelope tracking supply voltage $V_{cc(comp)}$, a series inductor L, a shunt capacitance C, and a current source representing a supply current $I_{cc}$ flowing from the envelope tracking power supply circuitry 22 to the one or more RF power amplifiers 12. Notably, the supply current $I_{cc}$ is dependent on the RF input signal $RF_{in}$, which varies over time. In particular, the supply current $I_{cc}$ may be represented by the power envelope measurement divided by some resistance $PE_m/R$ or the target voltage divided by some resistance $V_t/R$. Because of the impedance from the series inductor L and the shunt capacitor C, the supply current $I_{cc}$ will generate an undesired voltage across the one or more RF power amplifiers 12. This undesired voltage is referred to herein as a source impedance voltage, and may reduce headroom provided by the compensated envelope tracking supply voltage $V_{cc(comp)}$ resulting in compression or clipping, or may otherwise interfere with the operation of the envelope tracking power supply circuitry 22.

One way to mitigate the aforementioned problems includes providing equalization to the target supply voltage $V_t$ before modulation by the envelope modulator circuitry 16 in order to reduce or eliminate the source impedance voltage. Referring back to FIG. 7, in the case that equalization is applied to the target supply voltage $V_t$ before it is provided to the envelope synchronization circuitry 30, the equalization may affect the functionality of the envelope synchronization circuitry 30 discussed above such that the adjusted target supply voltage $V_{ta}$ no longer accurately tracks the power envelope of the RF input signal $RF_{in}$. In the case that equalization is applied to the adjusted target supply voltage $V_{ta}$ before it is provided to the envelope modulator circuitry 16, the adjustments made by the envelope synchronization circuitry 30 will make it difficult if not impossible to cancel the source impedance voltage, since the envelope synchronization circuitry 30 has effectively delayed or advanced the target supply voltage $V_t$ as discussed above such that it is no longer related to the RF input signal $RF_{in}$ as normally expected.

Figure 28:
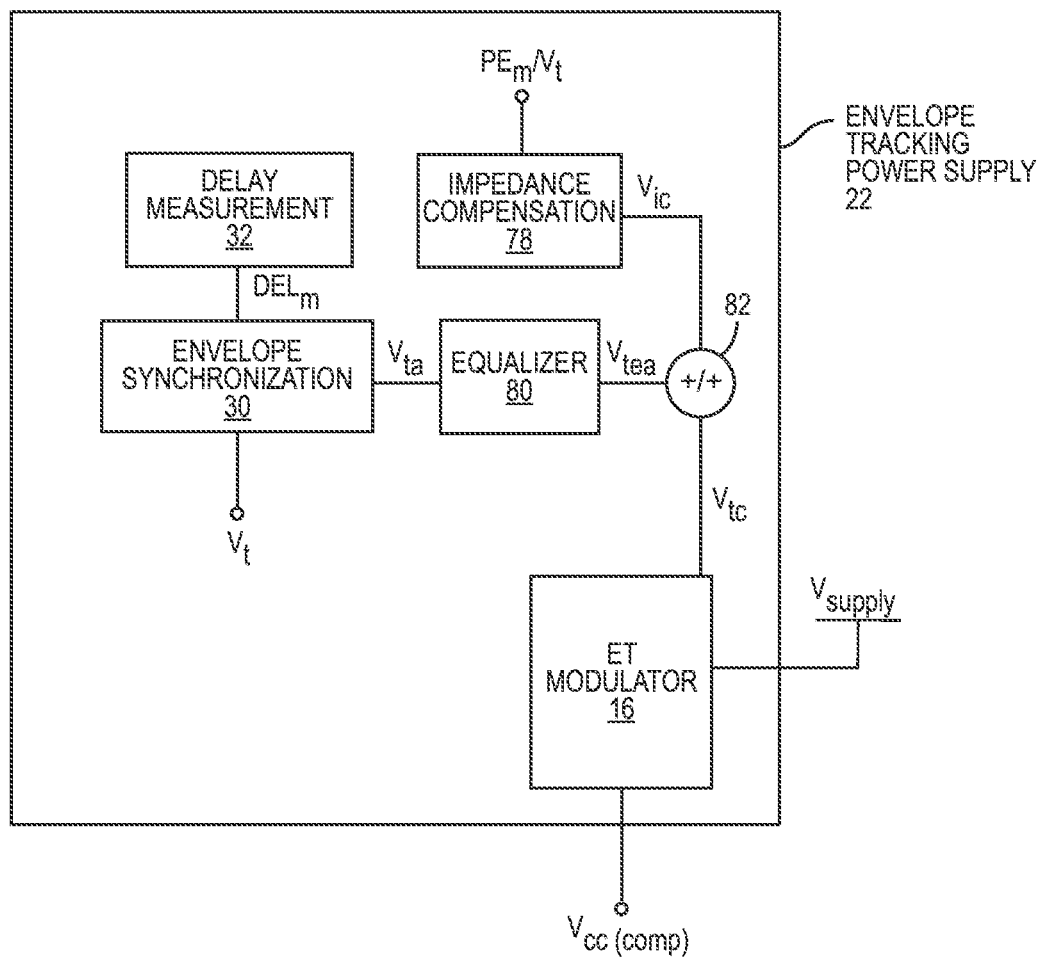
FIG. 28 is a functional schematic illustrating envelope tracking power supply circuitry according to one embodiment of the present disclosure.

To solve these problems, the envelope tracking power supply circuitry 22 shown in FIG. 28 further includes impedance compensation circuitry 78, equalizer circuitry 80, and adder circuitry 82. The impedance compensation circuitry 78 is configured to receive the power envelope measurement $PE_m$ or the target voltage $V_t$. Since the power envelope measurement $PE_m$ may be provided by the envelope tracking support circuitry 20 in the transceiver circuitry 14 or the power envelope detector circuitry 24, the impedance compensation circuitry 78 may be coupled to either of these parts accordingly. Similarly, since the target voltage $V_t$ can be provided by the envelope tracking support circuitry 20 in the transceiver circuitry 14 or the LUT 26, the impedance compensation circuitry 78 may be coupled to either of these parts accordingly. The equalizer circuitry 80 is coupled between the envelope synchronization circuitry 30 and the adder circuitry 82. In operation, the power envelope detector 24, the LUT 26, the envelope synchronization circuitry 30, and the delay measurement circuitry 32 behave as described above. The impedance compensation circuitry 78 receives the power envelope measurement $PE_m$ or the target voltage $V_t$ and provides an impedance compensation voltage $V_{ic}$, which is configured to cancel all or a portion of a source impedance voltage, which, as discussed above is generated due to the supply current $I_{cc}$ provided across the source impedance presented by the one or more RF power amplifiers 12. Accordingly, the impedance compensation voltage $V_{ic}$ may be equal to but opposite the source impedance voltage, or as close thereto as possible. As discussed above, the supply current $I_{cc}$ is related to the RF input signal $RF_{in}$. The power envelope measurement $PE_m$ or the target voltage $V_t$ can thus be used to generate the impedance compensation voltage $V_{ic}$ by performing any desired transformation thereon, and using a known value for or estimation of the source impedance $Z_{source}$, which may be pre-programmed or generated during a factory calibration process. Since the impedance compensation circuitry 78 uses the power envelope measurement $PE_m$ or the target voltage $V_t$, both of which have a known relationship to the RF input signal $RF_{in}$, an accurate estimate of the source impedance voltage can be provided, and thus the resulting impedance compensation voltage $V_{ic}$ can accurately cancel all or a portion thereof. The equalizer circuitry 80 provides equalization to the adjusted target supply voltage $V_{ta}$ to provide an equalized adjusted target supply voltage $V_{tea}$. In one embodiment, the equalizer circuitry 80 is configured to equalize the frequency response of the one or more RF power amplifiers 12. The series inductor L and the shunt capacitance C will result in a change in the response of the equivalent circuit with respect to frequency. The equalizer circuitry 80 may counter this effect in order to equalize the response over the frequency of the one or more RF power amplifiers 12. Notably, the equalizer circuitry 80 utilizes the adjusted target voltage $V_{ta}$ while the impedance compensation circuitry 78 utilizes the power envelope measurement $PE_m$ or the target voltage $V_t$. That is, the equalizer circuitry 80 uses a time-adjusted or windowed version of the target voltage $V_t$, while the impedance compensation circuitry 78 uses the power envelope measurement $PE_m$ or the target voltage $V_t$, which have not been adjusted in time. The adder circuitry 82 adds the equalized adjusted target supply voltage $V_{tea}$ and the impedance compensation voltage $V_{ic}$ to provide a compensated target supply voltage $V_{tc}$. The envelope modulator circuitry 16 operates as described above to generate the compensated envelope tracking supply voltage $V_{cc(comp)}$ based on the compensated target supply voltage $V_{tc}$.

Figure 29:
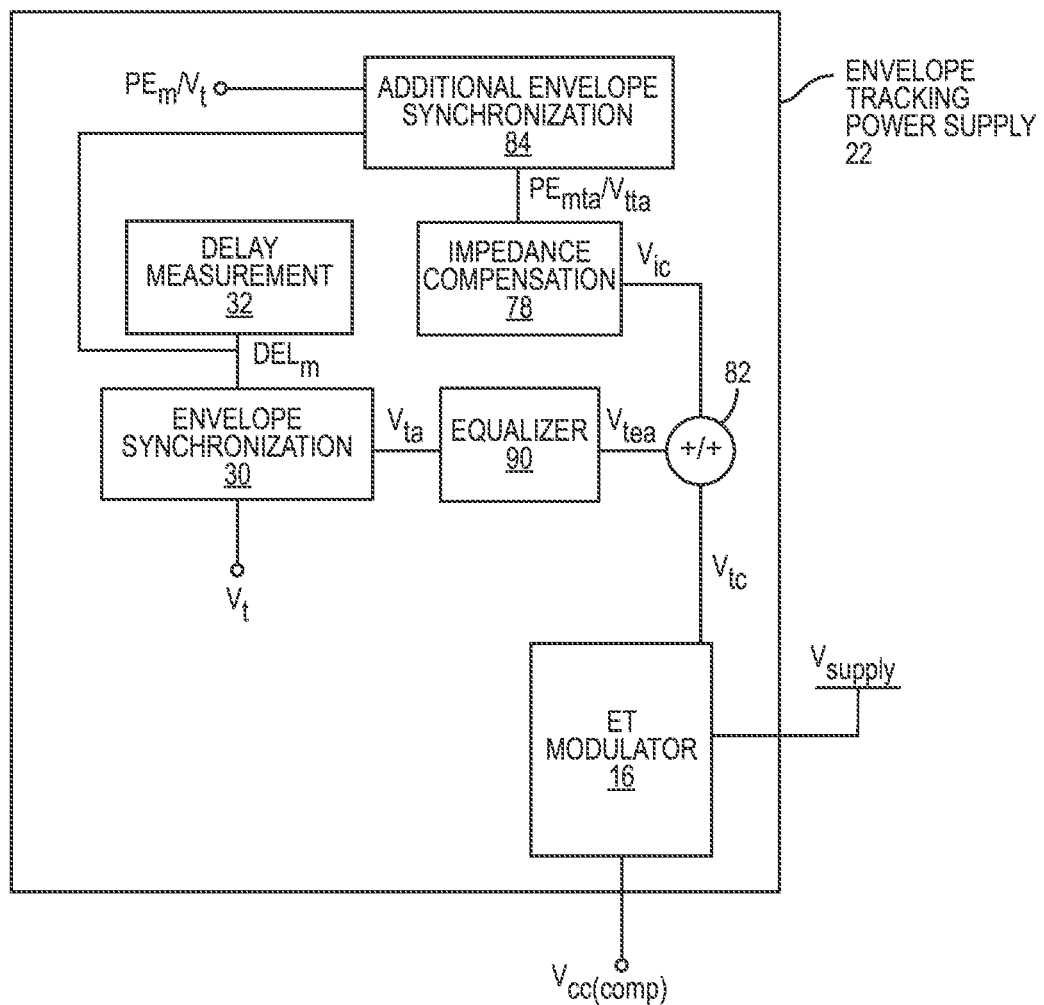
FIG. 29 is a functional schematic illustrating envelope tracking power supply circuitry according to one embodiment of the present disclosure.

As discussed above, there is some inherent delay between the power envelope measurement $PE_m$ and the actual power envelope of the RF input signal $RF_{in}$, as well as between the target voltage $V_t$ and the actual power envelope of the RF input signal $RF_{in}$. These delays are caused in part by the functionality of the power envelope detector circuitry 24 and the LUT 26, respectively. In some cases, this may interfere with the ability of the impedance compensation circuitry 78 to generate the impedance compensation voltage $V_{ic}$ for cancellation of the source impedance voltage. Accordingly, additional envelope synchronization circuitry 84 may be provided, as shown in FIG. 29. The additional envelope synchronization circuitry 84 is configured to time-align the power envelope measurement $PE_m$ or the target voltage $V_t$, depending on which is used, with the actual power envelope of the RF input signal $RF_{in}$ to provide a time-aligned power envelope measurement $PE_{mta}$, or a time-aligned target supply voltage $V_{tta}$. The additional envelope synchronization circuitry 84 may use the delay measurement $DEL_m$ from the delay measurement circuitry 32 to do so, effectively attempting to time delay or advance the power envelope measurement $PE_m$ or the target supply voltage $V_t$ as necessary to generate the impedance compensation voltage $V_{ic}$ so that it accurately cancels the source impedance voltage. Notably, the time-alignment performed by the additional envelope synchronization circuitry 84 may be different than that performed by the envelope synchronization circuitry 30. With a time-aligned power envelope measurement $PE_{mta}$ and/or time-aligned target supply voltage $V_{tta}$, the impedance compensation circuitry 78 can accurately generate the impedance compensation voltage $V_{ic}$ to partially or completely cancel the source impedance voltage.

To effectively equalize the frequency response of the one or more RF power amplifiers 12 and cancel the effect of the source impedance voltage, a combined transfer function of the impedance compensation circuitry 78 and the equalizer circuitry 80 should be equal to Equation (23):

$$TF = 1 + \frac{L}{R}*s + LC*s^2 \quad (23)$$

expressed in the Laplace domain. The first term $$\frac{L}{R}*s$$

is primarily responsible for cancelling the source impedance voltage, while the second term $LC*s^2$ is primarily responsible for equalizing the frequency response of the one or more RF power amplifiers 12. Accordingly, the impedance compensation circuitry 78 may provide the portion of the transfer function $$\frac{L}{R}*s$$

with the power envelope measurement $PE_m$, the target voltage $V_t$, or another signal related to the RF input signal $RF_{in}$ as an input discussed above. The equalizer circuitry 80 may provide the portion of the transfer function $LC*s^2$ with the adjusted target voltage $V_{ta}$ as discussed above. The combination of the outputs from the impedance compensation circuitry 78 and the equalizer circuitry 80 will equalize the frequency response of the one or more RF power amplifiers 12 while cancelling the source impedance voltage.

Figure 30:
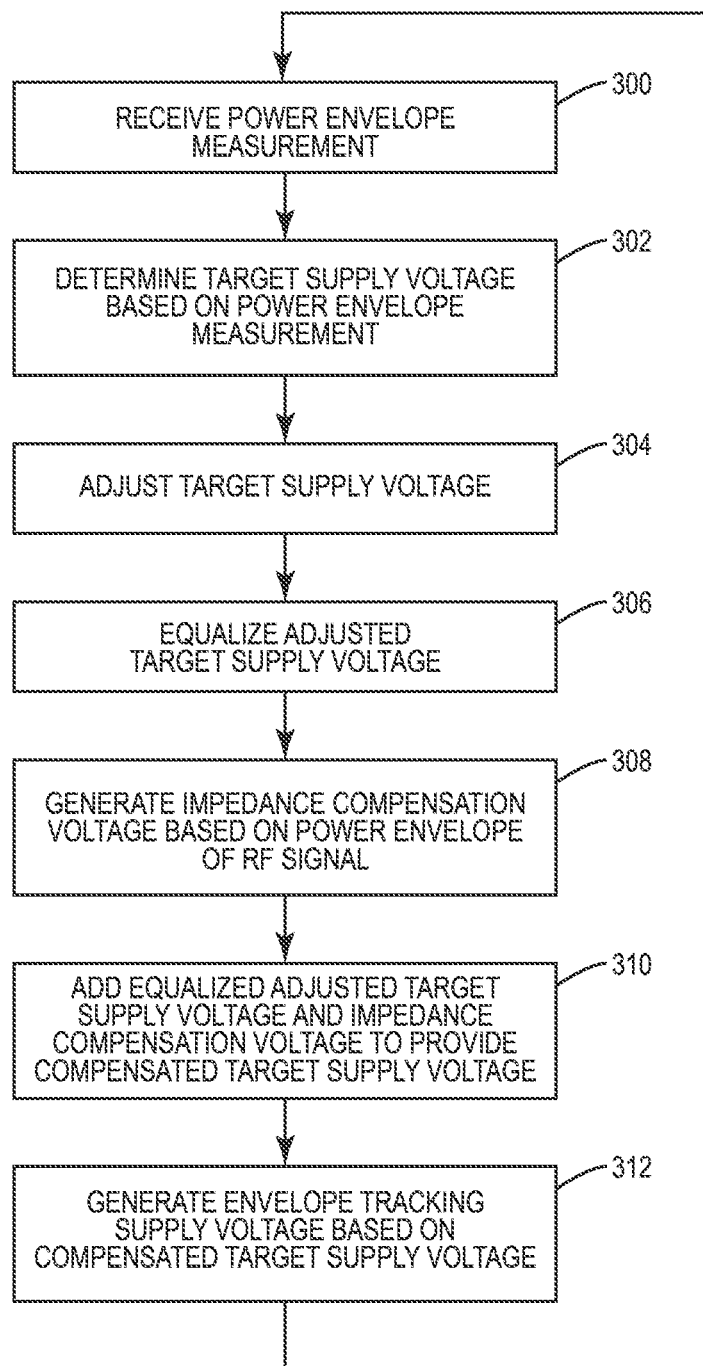
FIG. 30 is a flow diagram illustrating a method for operating an RF system according to one embodiment of the present disclosure.

FIG. 30 is a flow diagram illustrating a method for providing an envelope tracking supply voltage according to an additional embodiment of the present disclosure. First, a power envelope measurement is received (step 300). As discussed above, the power envelope measurement may be received via a coupler and measured by power envelope detector circuitry. A target supply voltage is then determined based on the power envelope measurement (step 302). As discussed above, the target supply voltage may be determined based on a look up in a LUT, which may be provided according to an isogain contour for an RF power amplifier. Further, as discussed above, the target supply voltage may be delayed with respect to an ideal supply voltage. Accordingly, the target supply voltage is adjusted based on a delay measurement (step 304), where the delay measurement indicates an amount of delay between the power envelope of the RF signal and the envelope tracking supply voltage. As discussed above, the target supply voltage may be adjusted by envelope synchronization circuitry. The adjusted target supply voltage is then equalized (step 306), resulting in an equalized adjusted target supply voltage. Any suitable equalization function may be applied to the adjusted target supply voltage, such as one that equalizes a bandwidth of the adjusted target supply voltage. The equalization may be performed by equalizer circuitry. An impedance compensation voltage is generated based on the power envelope of the RF signal (step 308), or any other signal related thereto such as the target voltage $V_t$. As discussed above, the impedance compensation voltage is configured to cancel at least a portion of a source impedance voltage, which is generated by a supply current being provided across a source impedance of one or more RF amplifiers. The impedance compensation voltage may be generated by impedance compensation circuitry. The equalized adjusted target supply voltage is then added to the impedance compensation voltage (step 310) to provide a compensated target supply voltage. This may be performed by adder circuitry. The envelope tracking supply voltage is then generated based on the compensated target supply voltage (step 312), e.g., via envelope tracking modulator circuitry. Details regarding each of the steps, and in particular how the target supply voltage is adjusted to provide the adjusted target supply voltage, are discussed above (see, e.g., Equations 1-13).

Figure 31:
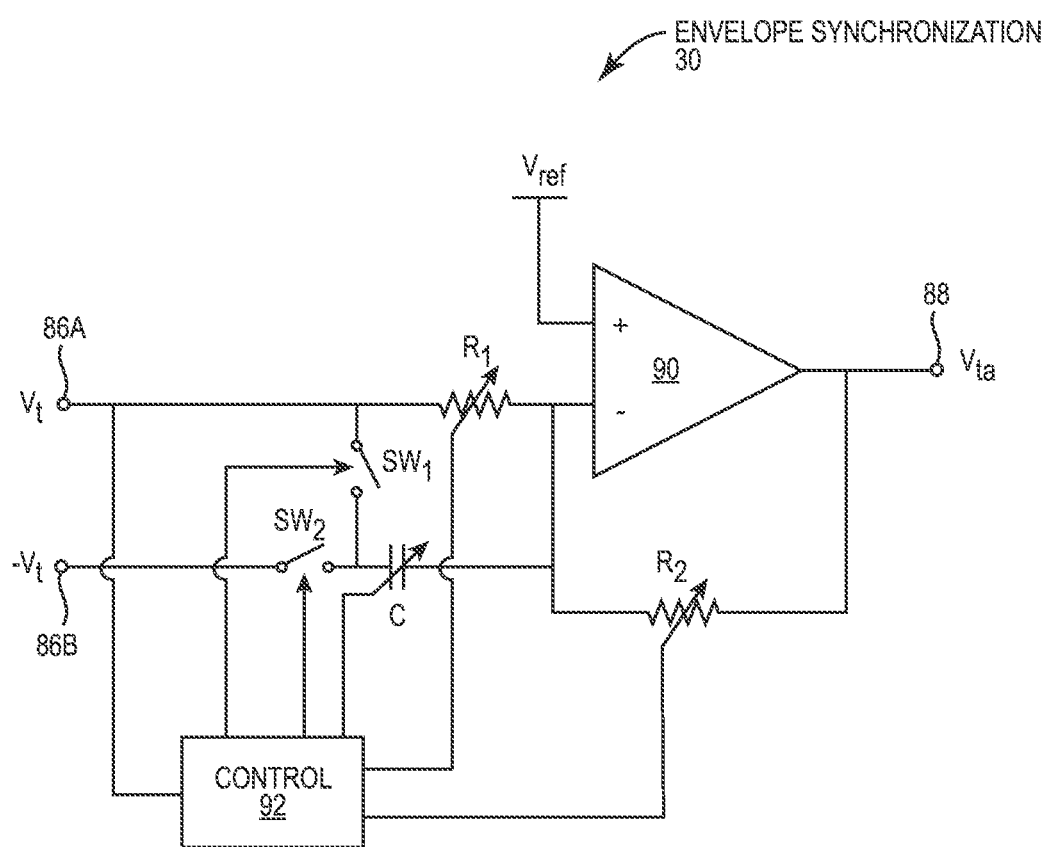
FIG. 31 is a functional schematic illustrating envelope synchronization circuitry according to one embodiment of the present disclosure.

FIG. 31 illustrates details of the envelope synchronization circuitry 30 according to one embodiment of the present disclosure. The envelope synchronization circuitry 30 includes a first input 86A, a second input 86B, an output 88, operational amplifier 90, control circuitry 92, a first resistor $R_1$, a second resistor $R_2$, a capacitor C, a first switch $SW_1$, and a second switch $SW_2$. The first input 86A is configured to receive a positive version of the target voltage $V_t$, and is coupled to an inverting input of the operational amplifier 90 via the first resistor $R_1$. The second input 86B is configured to receive a negative version of the target voltage $-V_t$, and is coupled to the inverting input of the operational amplifier 90 via the second switch $SW_2$ and the capacitor C. The first switch $SW_1$ is coupled between the first input 86A and the second input 86B. A non-inverting input of the operational amplifier 90 is coupled to a reference voltage $V_{ref}$, which could be any fixed voltage such as ground. An output of the operational amplifier 90 is coupled to the output 88. The second resistor $R_2$ is coupled between the inverting input of the operational amplifier 90 and the output 88. The first resistor $R_1$ and the second resistor $R_2$ are adjustable resistors, such that a resistance thereof can be changed in response to a control signal provided thereto. The control circuitry 92 is coupled to each of the first switch $SW_1$, the second switch $SW_2$, the first resistor $R_2$, and the second resistor $R_2$. In some embodiments the capacitor C is an adjustable capacitor that is also coupled to the control circuitry 92.

As discussed above, the envelope synchronization circuitry 30 is configured to receive and adjust the target voltage $V_t$ to provide the adjusted target voltage $V_{ta}$. In particular, the envelope synchronization circuitry 30 is configured to adjust the target voltage $V_{ta}$ so that it is synchronized in time with a power envelope of an RF signal. To do so, the envelope synchronization circuitry 30 performs both a linear and non-linear transform on the target voltage $V_t$ as discussed above with respect to Equations (1-13). The exemplary envelope synchronization circuitry 30 does so by implementing the transfer function shown in Equations (24) and (25):

$$TF_1 = -\frac{R_2}{R_1} * [1 + R_1 * C * s] \quad (24)$$

$$TF_2 = -\frac{R_2}{R_1} * [1 - R_1 * C * s] \quad (25)$$

where the first transfer function $TF_1$ is provided when the first switch $SW_1$ is closed and the second switch $SW_2$ is open and the second transfer function $TF_2$ is provided with the first switch $SW_1$ is open and the second switch $SW_2$ is closed. When the switches are arranged to provide the first transfer function $TF_1$, the envelope synchronization circuitry 30 provides a positive group delay. When the switches are arranged to provide the second transfer function $TF_2$, the envelope synchronization circuitry 30 provides a negative group delay. The amount of the group delay is dependent on the relationship between the resistance of the first resistor $R_1$, the resistance of the second resistor $R_2$, and the capacitance of the capacitor C. The control circuitry 92 is configured to operate the first switch $SW_1$ and the second switch $SW_2$ to provide either a positive group delay having a desired magnitude, effectively time advancing the target voltage $V_t$, or provide a negative group delay, effectively time delaying the target voltage $V_t$. In addition to a positive or negative group delay, the envelope synchronization circuitry also provides a gain as indicated by the above transfer functions. The control circuitry 92 is configured to change the gain of the envelope synchronization circuitry 30 by adjusting the value of the first resistor $R_1$, the second resistor $R_2$, and in some cases the capacitance of the capacitor C in order to implement a non-linear gain function as discussed above to reduce overshooting during peaks of the target voltage $V_t$. In particular, the control circuitry 92 may adjust the value of the first resistor $R_1$, the second resistor $R_2$, and/or the capacitor C to provide a non-linear gain response that is dependent on the derivative of the target voltage $dV_t/dt$ as discussed above with respect to FIGS. 17A and 17B. Those skilled in the art will appreciate that the first resistor $R_1$ and the second resistor $R_2$ may be implemented in any desirable fashion, such as by providing a static resistor in series with a field-effect transistor or in parallel with a field-effect transistor. The first switch $SW_1$ and the second switch $SW_2$ can similarly be implemented in any desired manner.

Notably, the configuration for the envelope synchronization circuitry 30 may be useful in other applications outside of the envelope tracking power supply circuitry 22. In general, the topology shown may be used to time delay or advance any signal while providing a desired non-linear gain, and is not limited to use on the target voltage $V_t$.

In some embodiments, instead of dynamically operating the first switch $SW_1$ and the second switch $SW_2$ to provide a positive group delay or a negative group delay while adjusting the first resistor $R_1$, the second resistor $R_2$, and/or the capacitor C to provide a desired adjusted target voltage $V_{ta}$ as discussed above, several versions of the circuitry shown in FIG. 31 may be provided and operated in a static fashion to separately provide a time-advanced version of the adjusted target voltage $V_{ta}$, a time-delayed version of the adjusted target voltage $V_{ta}$, and a non-adjusted version of the adjusted target voltage $V_{ta}$. A maximum signal detector may provide a maximum of these signals as the adjusted target voltage $V_{ta}$. In general, as discussed herein, the envelope synchronization circuitry 30 provides the adjusted target voltage $V_{ta}$, which is either time-delayed or time-advanced such that it is synchronized with a power envelope of an RF signal.

It is contemplated that any of the foregoing aspects, and/or various separate aspects and features as described herein, may be combined for additional advantage. Any of the various embodiments as disclosed herein may be combined with one or more other disclosed embodiments unless indicated to the contrary herein.

Those skilled in the art will recognize improvements and modifications to the preferred embodiments of the present disclosure. All such improvements and modifications are considered within the scope of the concepts disclosed herein and the claims that follow.

What is claimed is:

1. A radio frequency (RF) system comprising:
transceiver circuitry comprising:
envelope detector circuitry configured to generate a power envelope measurement indicative of a power envelope of an RF signal based on a baseband input signal;
a look-up-table (LUT) configured to provide a target supply voltage based on the power envelope measurement;
envelope synchronization circuitry configured to adjust the target supply voltage based on a delay between the target supply voltage and the power envelope of the RF signal to provide an adjusted target supply voltage that is synchronized in time with the power envelope of the RF signal; and
digital pre-distortion (DPD) circuitry configured to pre-distort the baseband input signal based on the adjusted target supply voltage to provide a pre-distorted baseband input signal.

2. The RF system of claim 1 wherein the transceiver circuitry further comprises modulator circuitry configured to modulate the pre-distorted baseband input signal to provide an RF input signal.

3. The RF system of claim 2 further comprising:
envelope tracking power supply circuitry configured to generate an envelope tracking supply voltage based on the adjusted target supply voltage;
one or more RF power amplifiers configured to amplify the RF input signal using the envelope tracking supply voltage to provide an RF output signal.

4. The RF system of claim 3 wherein the DPD circuitry is configured to offset the effect of adjustments made to the target supply voltage to provide the adjusted target supply voltage on the RF output signal.

5. The RF system of claim 4 wherein the DPD circuitry is configured to provide gain correction and phase correction to the baseband input signal.

6. The RF system of claim 5 wherein the DPD circuitry is configured to pre-distort the RF input signal based on a difference between the adjusted target supply voltage and the target supply voltage.

7. The RF system of claim 4 wherein the LUT is configured to provide the target supply voltage based on an isogain contour.

8. The RF system of claim 7 wherein the DPD circuitry is further configured to pre-distort the baseband input signal based on the isogain contour in order to offset the effects of the isogain contour on the RF output signal.

9. The RF system of claim 2 wherein the envelope detector circuitry, the LUT, and the envelope synchronization circuitry comprise digital circuitry.

10. The RF system of claim 2 further comprising digital-to-analog converter (DAC) circuitry.

11. The RF system of claim 10 wherein the DAC circuitry is configured to convert one of the power envelope measurement, the target supply voltage, and the adjusted target supply voltage to an analog signal, which is provided to the envelope tracking power supply circuitry.

12. A method comprising:
receiving a power envelope measurement, which is indicative of a power envelope of a radio frequency (RF) signal;
determining a target supply voltage, which is a target voltage for envelope tracking for one or more RF power amplifiers, based on the power envelope measurement;
adjusting the target supply voltage based on a delay between the target supply voltage and the power envelope of the RF signal to provide an adjusted target supply voltage;
pre-distorting an RF input signal based on the adjusted target supply voltage; and
generating an envelope tracking supply voltage based on the adjusted target supply voltage.

13. The method of claim 12 wherein pre-distorting the RF input signal comprises pre-distorting a baseband input signal and modulating the baseband input signal to generate the RF input signal.

14. The method of claim 13 further comprising amplifying the RF input signal to provide an RF output signal.

15. The method of claim 14 wherein pre-distorting the RF input signal based on the adjusted target supply voltage offsets the effect of adjustments made to the target supply voltage to provide the adjusted target supply voltage on the RF output signal.

16. The method of claim 15 wherein pre-distorting the RF input signal comprises providing gain correction and phase correction to the RF input signal.

17. The method of claim 16 wherein pre-distorting the RF input signal based on the adjusted target supply voltage comprises pre-distorting the RF input signal based on a difference between the target supply voltage and the adjusted target supply voltage.

18. The method of claim 15 wherein the target supply voltage is determined based on an isogain contour.

19. The method of claim 18 wherein pre-distorting the RF input signal is based on the adjusted target supply voltage and the isogain contour such that the pre-distortion offsets the effects of the isogain contour on the RF output signal.

* * * * *